US011031371B2

(12) United States Patent
Chiu et al.

(10) Patent No.: US 11,031,371 B2
(45) Date of Patent: Jun. 8, 2021

(54) SEMICONDUCTOR PACKAGE AND METHOD OF FABRICATING SEMICONDUCTOR PACKAGE

(71) Applicant: SANDISK INFORMATION TECHNOLOGY (SHANGHAI) CO., LTD., Shanghai (CN)

(72) Inventors: Chin Tien Chiu, Taichung (TW); Tiger Tai, Shanghai (CN); Ken Qian, Shanghai (CN); C C Liao, Changhua (TW); Hem Takiar, Fremont, CA (US); Gursharan Singh, Fremont, CA (US)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 30 days.

(21) Appl. No.: 15/704,984

(22) Filed: Sep. 14, 2017

(65) Prior Publication Data
US 2018/0114773 A1    Apr. 26, 2018

(30) Foreign Application Priority Data
Oct. 26, 2016 (CN) .......................... 201610949420.3

(51) Int. Cl.
*H01L 25/065* (2006.01)
*H01L 23/00* (2006.01)
(Continued)

(52) U.S. Cl.
CPC .......... *H01L 25/0652* (2013.01); *H01L 24/24* (2013.01); *H01L 24/25* (2013.01);
(Continued)

(58) Field of Classification Search
CPC ......... H01L 24/25; H01L 25/18; H01L 24/73; H01L 24/24; H01L 25/0652
See application file for complete search history.

(56) References Cited

U.S. PATENT DOCUMENTS 5,637,536 A * 6/1997 Val .................... H01L 25/0657
438/686
6,861,287 B2 * 3/2005 Farrar ................ H01L 25/0652
257/E25.011
(Continued)

FOREIGN PATENT DOCUMENTS

CN        103545280      1/2014
KR     20120101993 A     9/2012

OTHER PUBLICATIONS

Response to Office Action filed Sep. 28, 2018 in Korean Patent Application No. 10-2017-0113300.
(Continued)

*Primary Examiner* — Marcos D. Pizarro
*Assistant Examiner* — Quinton A Brasfield
(74) *Attorney, Agent, or Firm* — Vierra Magen Marcus LLP

(57) ABSTRACT

The present technology relates to a semiconductor package. The semiconductor package comprises: a first component comprising a plurality of first dies stacked on top of each other, each of first dies comprising at least one side surface and an electrical contact exposed on the side surface, and the plurality of first dies aligned so that the corresponding side surfaces of all first dies substantially coplanar with respect to each other to form a common sidewall; a first conductive pattern formed over the sidewall and at least partially spaced away from the sidewall, the first conductive pattern electrically interconnecting the electrical contacts of the plurality of first dies; at least one second component; and a second conductive pattern formed on a surface of the second component, the second conductive pattern affixed and electrically connected to the first conductive pattern formed over the sidewall of the first component.

17 Claims, 25 Drawing Sheets

(51) Int. Cl.
  *H01L 25/18* (2006.01)
  *H01L 25/00* (2006.01)
(52) U.S. Cl.
  CPC .......... *H01L 24/73* (2013.01); *H01L 25/0657* (2013.01); *H01L 25/18* (2013.01); *H01L 25/50* (2013.01); *H01L 24/05* (2013.01); *H01L 24/16* (2013.01); *H01L 24/48* (2013.01); *H01L 24/81* (2013.01); *H01L 24/82* (2013.01); *H01L 2224/02371* (2013.01); *H01L 2224/02377* (2013.01); *H01L 2224/0401* (2013.01); *H01L 2224/05548* (2013.01); *H01L 2224/13144* (2013.01); *H01L 2224/13147* (2013.01); *H01L 2224/14131* (2013.01); *H01L 2224/16137* (2013.01); *H01L 2224/16145* (2013.01); *H01L 2224/244* (2013.01); *H01L 2224/245* (2013.01); *H01L 2224/24051* (2013.01); *H01L 2224/24105* (2013.01); *H01L 2224/24147* (2013.01); *H01L 2224/2512* (2013.01); *H01L 2224/2518* (2013.01); *H01L 2224/25175* (2013.01); *H01L 2224/2919* (2013.01); *H01L 2224/32145* (2013.01); *H01L 2224/48091* (2013.01); *H01L 2224/48145* (2013.01); *H01L 2224/73207* (2013.01); *H01L 2224/73209* (2013.01); *H01L 2224/73227* (2013.01); *H01L 2224/73253* (2013.01); *H01L 2224/73257* (2013.01); *H01L 2224/73267* (2013.01); *H01L 2224/82051* (2013.01); *H01L 2224/82106* (2013.01); *H01L 2224/82948* (2013.01); *H01L 2225/06506* (2013.01); *H01L 2225/06513* (2013.01); *H01L 2225/06524* (2013.01); *H01L 2225/06551* (2013.01); *H01L 2225/06555* (2013.01)

(56) References Cited

U.S. PATENT DOCUMENTS

| | | | |
|---|---|---|---|
| 2009/0085224 A1 | 4/2009 | Choi et al. | |
| 2011/0169171 A1 | 7/2011 | Marcoux | |
| 2012/0211867 A1* | 8/2012 | Seroff | H01L 25/0652 257/532 |
| 2014/0015144 A1* | 1/2014 | Kim | H01L 23/5384 257/774 |
| 2014/0264611 A1* | 9/2014 | Lee | H01L 24/37 257/368 |
| 2016/0005718 A1* | 1/2016 | Cheah | H01L 23/3142 257/774 |

OTHER PUBLICATIONS

Notice of Preliminary Rejection dated Jul. 16, 2018 in Korean Patent Application No. 10-2017-0113300.
English language Abstract of KR20120101993 published Sep. 17, 2012.
English language Abstract for CN103545280 published Jan. 29, 2014.

* cited by examiner

SEMICONDUCTOR PACKAGE AND METHOD OF FABRICATING SEMICONDUCTOR PACKAGE

BACKGROUND OF THE INVENTION

Field

The present technology relates to semiconductor packages.

Description of Related Art

The strong growth in demand for portable consumer electronics is driving the need for high-capacity storage components. The semiconductor memory components, such as flash memory storage cards, are becoming widely used to meet ever-growing demands on digital information storage and exchange. Their portability, versatility and rugged design, along with their high reliability and large capacity, have made such memory components ideal for use in a wide variety of electronic components, including for example digital cameras, digital music players, video game consoles, PDAs and cellular telephones.

While various packaging configurations are known, flash memory storage cards are typically fabricated as system-in-a-package (SiP) or multichip module (MCM), where a plurality of die are mounted and interconnected on a substrate, and encapsulated within a molding compound. FIG. 1A and FIG. 1B are a top view and a side view of a conventional semiconductor package 100. The semiconductor package 100 includes a substrate 110 and a plurality of dies including a memory die 120 and a controller die 130 arranged side by side on the substrate 110. The memory die 120 and the controller die 130 can be connected to the substrate 110 by solder balls 122 or bonding wires 132, respectively. FIG. 2A and FIG. 2B shows another conventional semiconductor package 200. The semiconductor package 200 includes a substrate 210 and a plurality of dies including a memory die 220 and a controller die 230 stacked vertically on the substrate 210. The memory die 220 and the controller die 230 can be connected to the substrate 210 by solder balls 222 or bonding wires 232, respectively. In both configurations, the semiconductor package includes a substrate for supporting and accommodating dies and other elements (not shown) such as passive devices including resistors, capacitors or inductors.

DETAILED DESCRIPTION

Embodiments will now be described with reference to FIG. 3A through FIG. 23B, which relate to a semiconductor package and a fabricating method of a semiconductor package. It is understood that the present technology may be embodied in many different forms and should not be construed as being limited to the embodiments set forth herein. Rather, these embodiments are provided so that this disclosure will be thorough and complete and will fully convey the present technology to those skilled in the art. Indeed, the present technology is intended to cover alternatives, modifications and equivalents of these embodiments, which are included within the scope and spirit of the invention as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "left", "right", "top," "bottom," "upper," "lower," "vertical" and/or "lateral" as may be used herein are for convenience and illustrative purposes only, and are not meant to limit the description of the present technology inasmuch as the referenced item can be exchanged in position. Also, as used herein, the articles "a" and "an" are intended to include both single and plurality forms, unless the content clearly indicates otherwise. The terms "substantially" and/or "about" mean that the specified dimension or parameter may be varied within an acceptable manufacturing tolerance for a given application. In one embodiment, the acceptable manufacturing tolerance is ±0.25%.

Throughout the figures, same or similar components are labeled in the same fashion with the same last two digits.

Figure 1A:
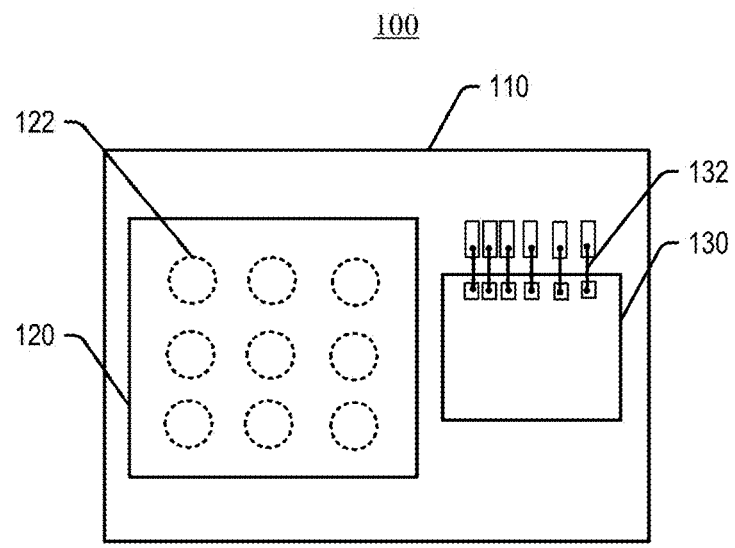
FIG. 1A and FIG. 1B are a schematic top view and a schematic side view of a conventional semiconductor package.
Figure 1B:
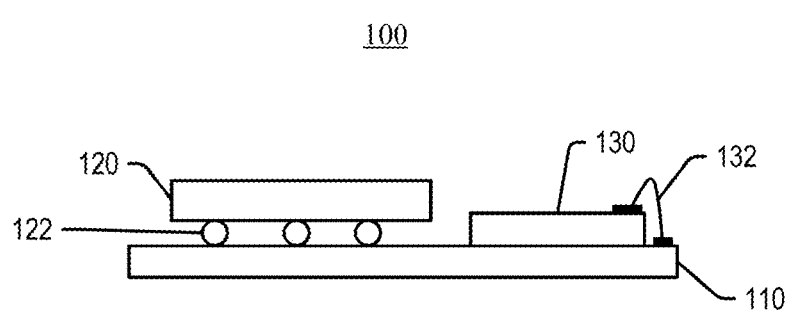
Figure 2A:
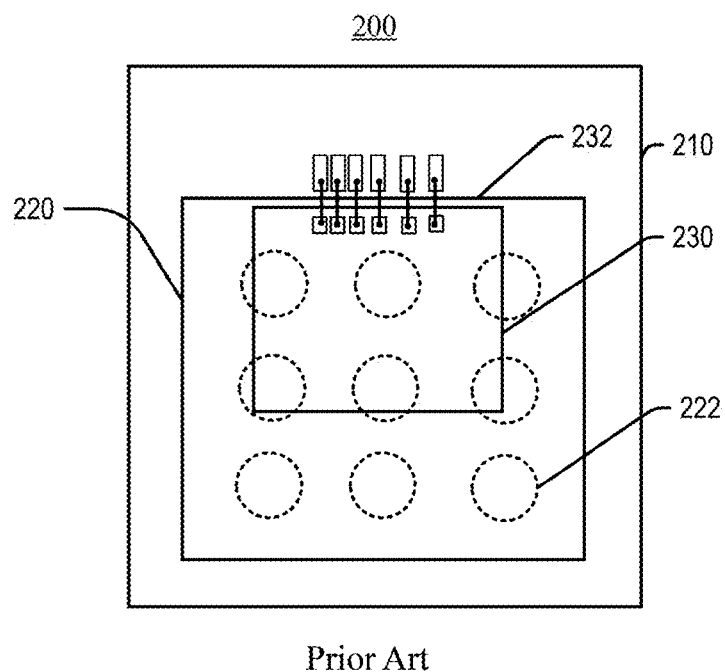
FIG. 2A and FIG. 2B are a schematic top view and a schematic side view of another conventional semiconductor package.
Figure 2B:
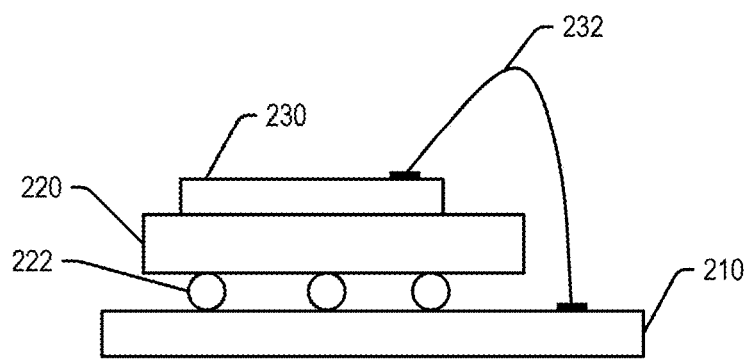
Figure 3A:
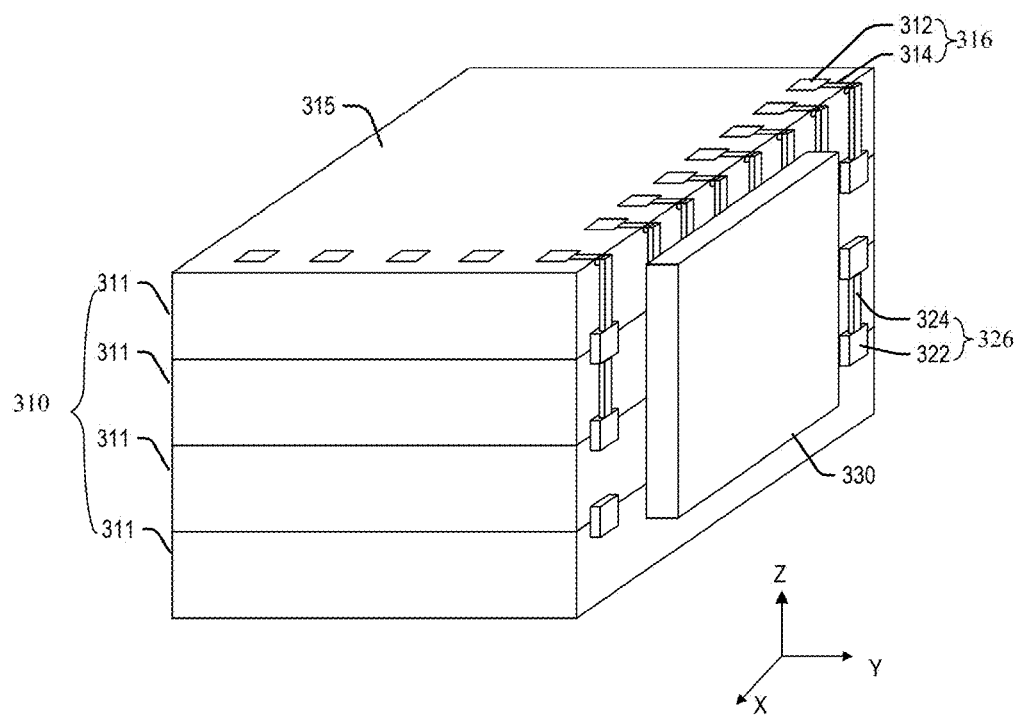
FIG. 3A to 3D are a schematic perspective view, a schematic front view, a schematic top view and a schematic sectional view taken along line D-D' in FIG. 3B and FIG. 3C of a semiconductor package according to an embodiment of the present technology, respectively.
Figure 3B:
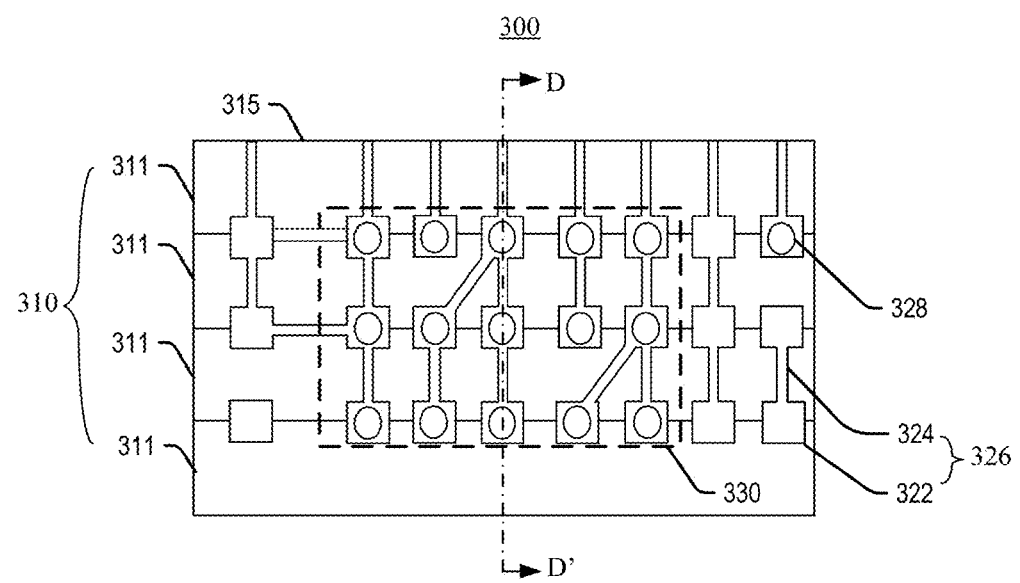
Figure 3C:
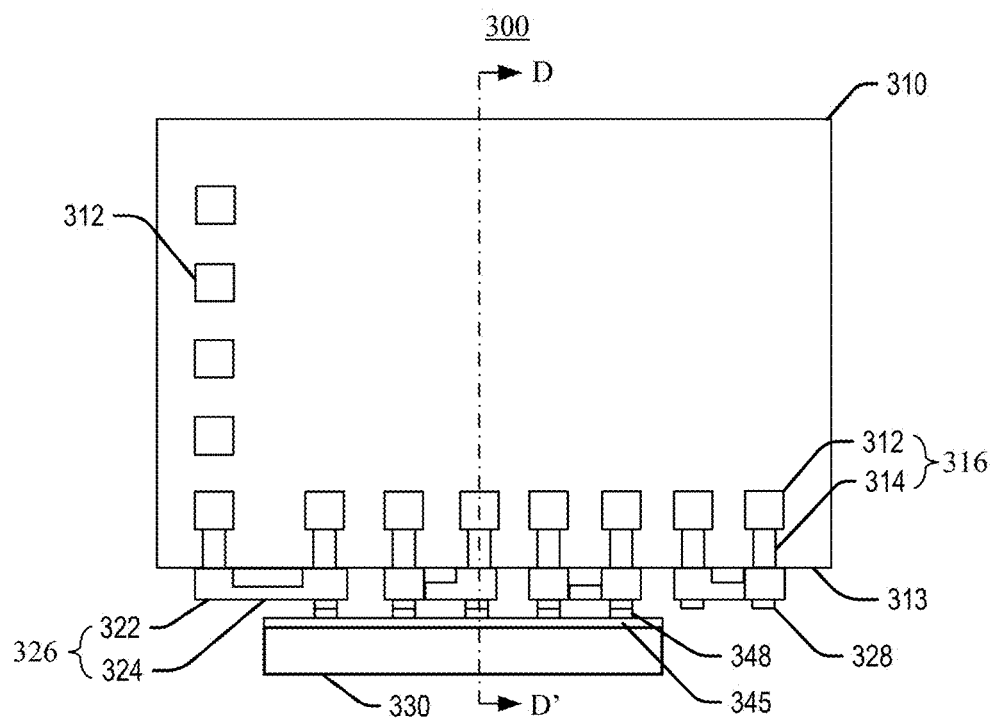

An embodiment of the present technology will now be described with reference to a schematic perspective view of FIG. 3A, a schematic front view of FIG. 3B, a schematic top view of FIG. 3C and a schematic sectional view of FIG. 3D taken along line D-D' in a semiconductor package shown in FIG. 3B and FIG. 3C according to an embodiment of the present technology.

Figure 3D:
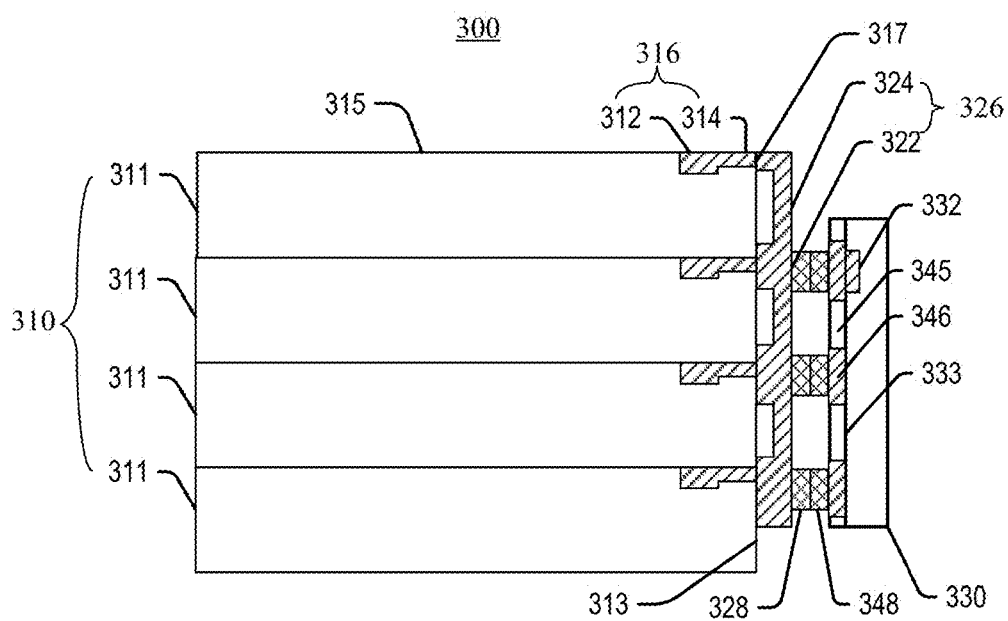

Referring to FIG. 3A to FIG. 3D, the semiconductor package 300 includes a first component 310 including a plurality of dies 311 stacked vertically via an adhesive layer such as a DAF (die attach film) layer (not shown). The dies 311 can include memory dies for example with a same dimension. All dies 311 in the first component 310 are aligned with at least one corresponding side surface substantially coplanar with respect to each other to form a common sidewall 313. The number of dies 311 in the first component 310 may vary, including for example 2, 4, 8, 16 or 32 dies. There may be other numbers of dies in the stack in further embodiments. Each of dies 311 includes a conductive pattern 316 formed on an active surface 315 where electronic elements and circuitry are fabricated. As shown in FIG. 3D, the conductive pattern 316 can have an upper surface coplanar with the upper surface of each of dies 311, and can be made of gold, copper, aluminum or alloy thereof. At least a part of the conductive pattern 316 is exposed on the sidewall 313 to form electrical contacts 317 (only one of them is labeled). The conductive pattern 316 can include traces 314 (only one of them is labeled) extending to the sidewall 313, thus such electrical contacts 317 are exposed ends of traces 314. Optionally, the conductive pattern 316 can further include a plurality of bonding pads 312 arranged along and spaced from the edges of the respective one of dies 311, and the traces 314 are extended from the respective bonding pads 312 to the sidewall 313. Such conductive pattern 316 including the bonding pads 312 in the present embodiment enables utilizing conventional dies including the bonding pads 312 on which wire bonding processes are performed. The conductive pattern 316 is also electrically to other circuitry of the respective one of the dies 311, which is not shown for the sake of simplicity of illustration. Alternatively, the electrical contacts on the sidewall can include exposed edges of bonding pads aligned directly along the sidewall. In this case, the electrical contacts formed by the bonding pads have a greater exposed area than those formed by traces, thus improving reliability of subsequent electrical connection to be formed on the electrical contacts. The conductive pattern 316 on the active surface 315 of each of the dies 311 according to the present technology can have various configurations other than those described as above.

The semiconductor package 300 further includes a first conductive pattern 326 formed over the sidewall 313 of the first component 310 and at least partially spaced away from the sidewall 313. The first conductive pattern 326 is in direct contact with the exposed electrical contacts 317 of the first dies 311 on the sidewall 313 to be electrically coupled to the first dies 311 of the first component 310. Such conductive pattern formed on the sidewall of the die stack of a component can be referred as "The SideWall" (TSW) structure. The first conductive pattern 326 can serve as a redistribution layer (RDL) so as to fan out electrical contacts 317 exposed on the sidewall 313 of the first component 310. The first conductive pattern 326 can include a plurality of bonding pads 322 (only one of them is labeled) and traces 324 (only one of them is labeled) extending from the respective bonding pads 322. Each of the bonding pads 322 can be configured in a shape of square, rectangular, circular, oval or the like, which offers a greater bonding area than the traces 324 of line shape extending from the respective bonding pad 322. Such sidewall pattern design of the first conductive pattern 326 including the bonding pads 322 provides a greater bonding area for any components to be attached on the sidewall in subsequent processes, which will be described more in detail. The first conductive pattern 326 can be made of a conductive material such as copper, gold, aluminum, tungsten, nickel or alloys thereof.

The semiconductor package 300 further includes a second component 330 attached on the sidewall 311 of the first component 310. The second component 330 is shown as a see-through component indicated with dashed lines for the sake of clarity in FIG. 3B. The second component can have a dimension smaller than that of the first component 311. For example, the second component 330 can include a controller die, an interposer, a charge pump or a passive device, for example a resistor, a capacitor or an inductor configured in a die form or a SMT form such as BGA. Alternatively, the second component can be configured with a similar or even a greater dimension in comparison with that of the first component. For example, the second component 330 can include a multilayer printed circuit board including alternating conductive pattern layers and the insulating interlayers. The second component 330 includes electrical contacts 332 (only one of them is labeled) such as bonding pads formed on a surface 333 of the second component 330.

In addition, the semiconductor package 300 can include a second conductive pattern 346 formed over the surface 333 of the second component 330. The second conductive pattern 346 is electrically connected to the electrical contacts 332 of the second component 330, serving as a redistribution layer (RDL) to fan out the electrical contacts 332 on the surface 333 of the second component 300. Similarly, the second conductive pattern 346 can also include bonding pads 342 and traces 344 extended from respective bonding pads 342. The bonding pads 342 are arranged so that corresponding bonding pads 342 of the second conductive pattern 346 and bonding pads 322 of the first conductive pattern 326 oppose each other in position upon aligning the second component 330 relative to the first component 310, as shown in FIG. 3D. For example, both the bonding pads 322 and the bonding pads 342 are arranged in an array with substantially same spacing between adjacent bonding pads. In this way, the opposing bonding pads 322 and bonding pads 342 of the aligned first component 310 and second component 330 can provide multiple bonding sites distributed across the sidewall 313, thus improve reliability and stability upon attaching the second component 330 onto the sidewall 313 of the first component 310. The second conductive pattern 346 can be embedded in an insulating layer 345 on the surface 333, as shown in FIG. 3D. Alternatively, the second conductive pattern 346 can be formed on the surface 333 without the insulating layer 345. The second conductive pattern 346 can be made of a conductive material such as copper, gold, aluminum, tungsten, nickel or alloys thereof.

The semiconductor package 300 can further include a plurality of connectors bonded between the first conductive pattern 326 and second conductive pattern 346, serving as bonding members for affixing the second component 330 onto the sidewall 313 of the first component 311 and electrically connecting the first component 310 and the second component 330 via the connectors and the RDLs such as the first conductive pattern 326 and the second conductive pattern 346. As shown in FIG. 3D, the connectors can include first connectors 328 (only one of them is labeled) disposed on the first conductive pattern 326 for example on the bonding pads 322, and second connectors 348 (only one of them is labeled) disposed on the second conductive pattern 346 for example on the bonding pads 342. In this case, the corresponding first connectors 328 and second connectors 348 on respective bonding pads 324 and 344 are bonded together, physically and electrically connecting corresponding first and second conductive pattern 326 and 346, which in turn affixes the second component 330 onto the sidewall 313 of the first component 311. Alternatively, the second component 330 can be affixed onto the sidewall 313 by bonding only one of the first connectors 328 and the second connectors 348 to both the first conductive pattern 326 and the second conductive pattern 346. In the present embodiment, the connectors not only serve as bonding members physically bonding the first component 310 and the second component 330, but also as electrical connectors electrically coupling the first component 310 and the second component 330. The first and second connectors 328 and 348 can include conductive balls or bumps, for example solder balls, gold balls, gold bumps or copper bumps bonded on the respective bonding pads by a metal deposition process known for the skilled in the art.

Since the connectors for affixing the first component 310 and the second component 330 are disposed on the bonding pads 322 and 342 with a larger bonding surface than straight line traces, the connectors can be formed with a larger footprint and corresponding greater bonding area on the first and second conductive patterns, thus improving bonding strength between the first component 310 and the second component 330. This can significantly improve the reliability of the semiconductor package 300.

The semiconductor package 300 can further include a protective material (not shown) encapsulating the first and second components and corresponding first and second conductive patterns within the protective material such as a molding compound for protecting the package against the environment.

The semiconductor package according to the present technology can be fabricated as flash memory device such as storage class memory devices or solid state drives or blades.

In the semiconductor package according to the present technology, the components for example the controller dies or passive devices are attached on the sidewall of the first component including for example a memory die stack in a so-called TSW configuration. In this way, various components with different functionalities other than the stacked memory dies can be incorporated into a semiconductor package, thus greatly improving design flexibility for the package in the TSW configuration. The semiconductor package has a minimal footprint on a host device (not shown) due to the vertical alignment of the memory die stack. In addition, the semiconductor package according to the present embodiment can be configured as a substrate-less package without an additional substrate for supporting and accommodating those components in the conventional semiconductor package shown in FIG. 1A to FIG. 2B. In this case, the dimension of the semiconductor package can be reduced, allowing further miniaturization of the semiconductor package.

In addition, the sidewall conductive pattern design including bonding pads allows disposing connectors with greater bonding area on the opposing first and second conductive patterns, thus improving bonding strength between the first component and second component attached on the sidewall of the first component. Furthermore, the semiconductor package of the present embodiment utilizes the sidewall conductive pattern including the first conductive pattern and connectors to electrically interconnect memory dies and other components in the package without any wire bonds, which can enable quick circuit operation due to length reduction of signal channel and improve reliability and robust of the semiconductor package by eliminating wire bonding processes.

A fabricating method of a semiconductor package according to an embodiment of the present technology will now be explained by referring to a flow chart of FIG. 4 and schematic views of FIG. 5A-11B.

Figure 4:
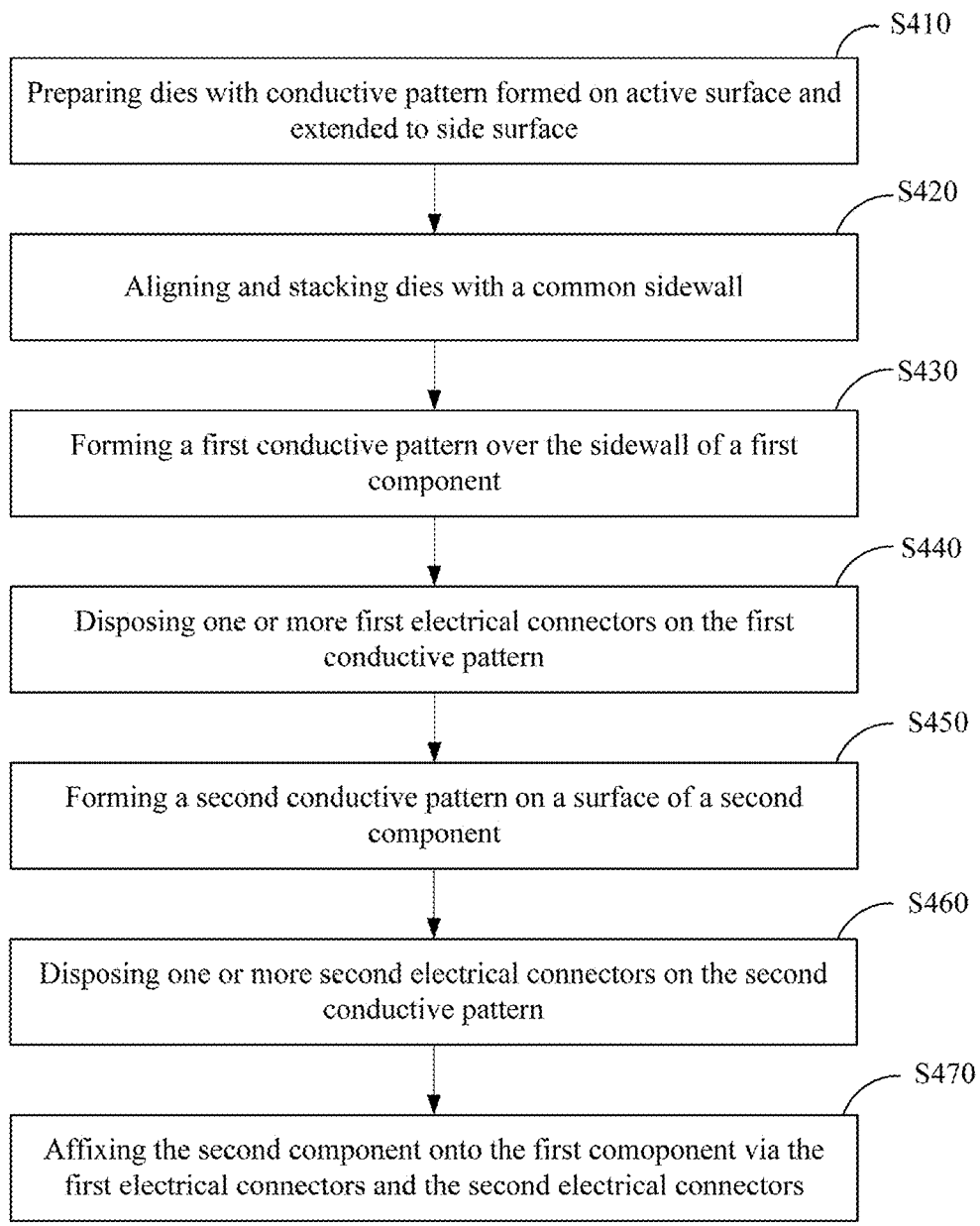
FIG. 4 is a flow chart showing a fabricating method of a semiconductor package according to an embodiment of the present technology.
Figure 5A:
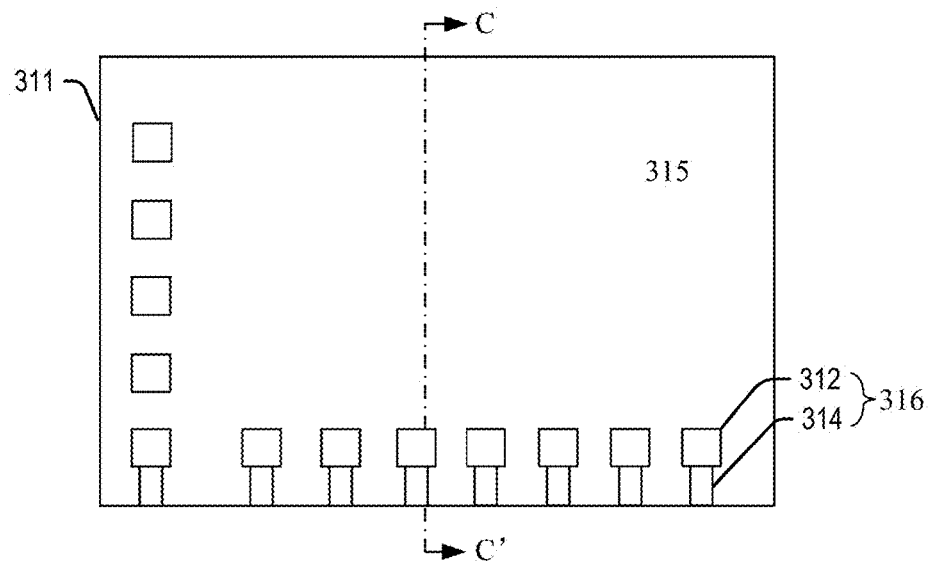
FIG. 5A to FIG. 11B are schematic views of different steps of the fabricating method of a semiconductor package according to an embodiment of the present technology shown in FIG. 4.
Figure 5B:
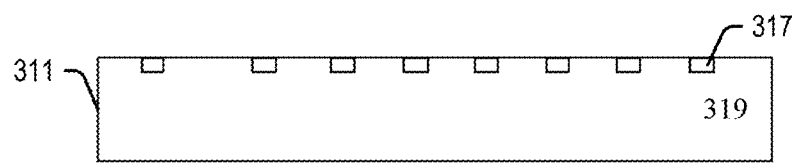
Figure 5C:
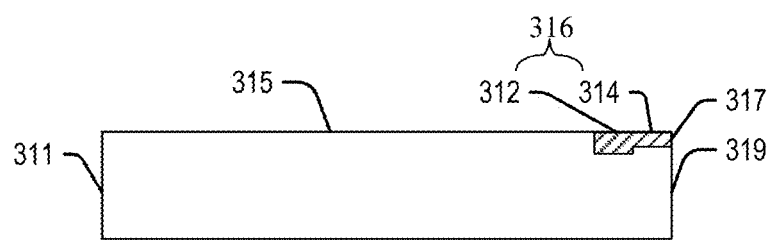

As shown in FIG. 4, the method starts at a step of S410 of preparing a plurality of dies 311. One of the dies 311 is shown in a schematic top view of FIG. 5A, a schematic front view of FIG. 5B and a schematic sectional view of FIG. 5C taken along line C-C' in FIG. 5A. Each of dies 311 includes a conductive pattern 316 formed on an active surface 315 of the respective die. The conductive pattern 316 for example includes bonding pads 312 and traces 314 extending from at least some of the bonding pads 312 to a side surface 319 of the respective die. The exposed ends of the traces 314 on the side surface 319 become electrical contacts 317 on the respective side surface 319. The conductive pattern 316 can be formed in steps of preparing electronic elements and interconnecting circuits during wafer fabrication stage by a known lithography process including steps of deposition of metal layer, exposing and developing a photomask, etching and removal of the photomask. In this case, the bonding pads 312 can be omitted by implementing new masks for the lithography process so as to route the circuitry of each of dies 311 directly to the side surface 319 by the traces 314. Alternatively, the bonding pads 312 and the traces 314 of the conductive pattern 316 can be fabricated in multiple stages. For example, in wafer fabricating stage, the dies including only bonding pads 312 are prepared. The bonding pads 312 are made for wire bonding process for conventional fabricating method. Then the traces 314 of the conductive pattern 316 can be fabricated as low profile tie bars in a separate step. For example, after singularizing the dies 311 from the wafer, each of dies 311 is subjected to an additional metallization process such as a screen printing or a lithography process to fabricate the tie bars of the traces 314. In this case, conventional dies can be utilized without changing mask design during wafer fabricating stage. The conductive pattern 316 can be made of gold, copper, aluminum, or alloy thereof.

Figure 6A:
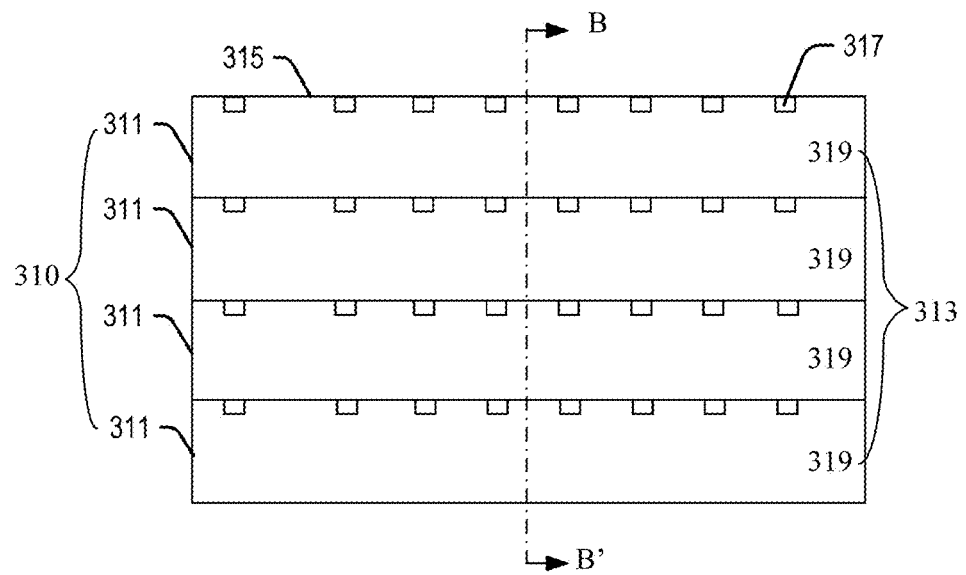
Figure 6B:
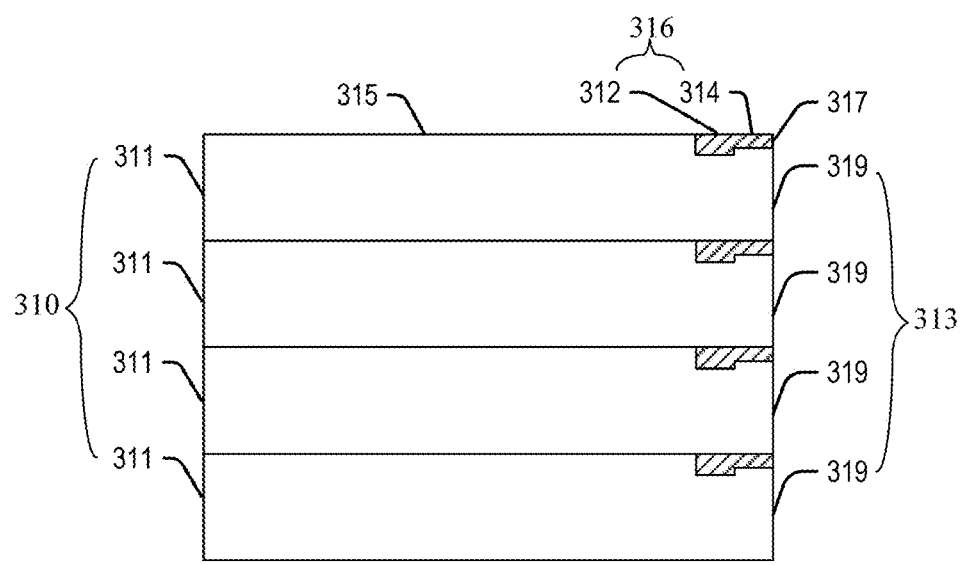

Next, at a step 420, as shown in a schematic front view of FIG. 6A and a schematic sectional view of FIG. 6B taken along line B-B' in FIG. 6A, the dies 311 are aligned and stacked vertically so that the corresponding side surfaces 319 of dies 311 are substantially coplanar with respect to each other to form a common sidewall 313. The dies 311 are affixed to each other by adhesive layers such as DAF (not shown). Other details of the first component 310 have been described in the previous embodiment, and thus will not be repeated herein.

Figure 7A:
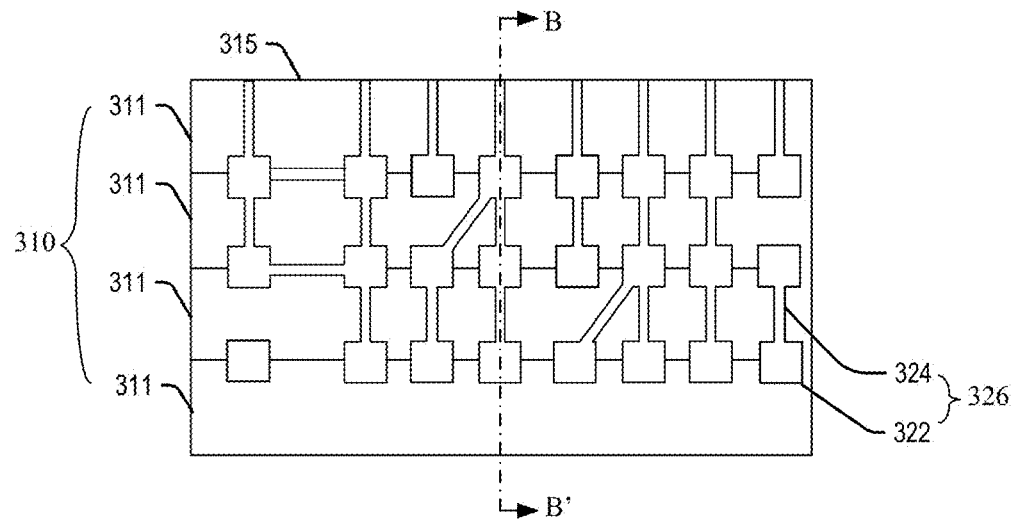
Figure 7B:
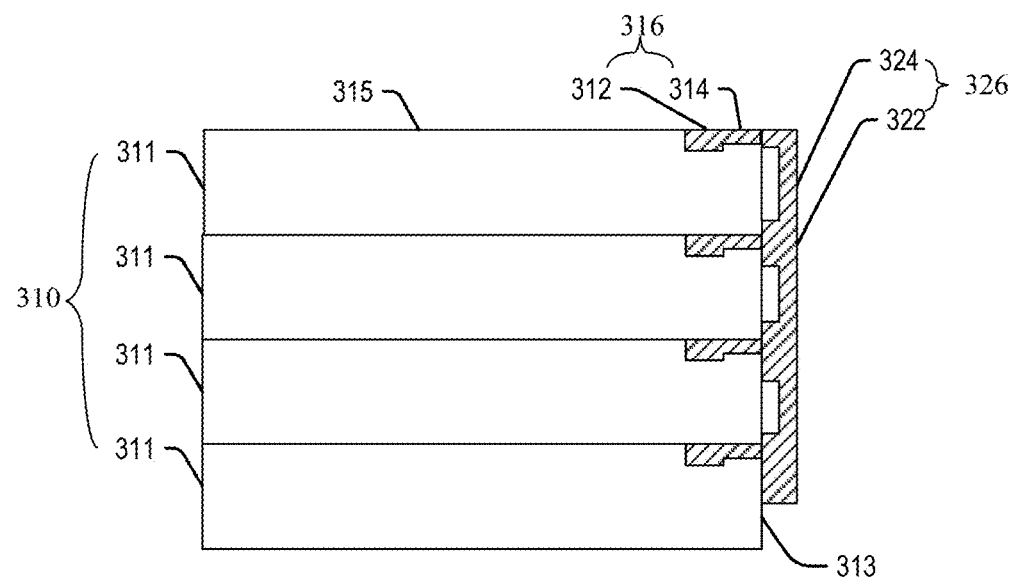

Next, at a step S430, as shown in a schematic front view of FIG. 7A and a schematic sectional view of FIG. 7B taken along line B-B' in FIG. 7A, a first conductive pattern 326 is formed over the sidewall 313 of the first component 310, and at least partially spaced from the sidewall 313. The first conductive pattern 326 is in direct contact with the electrical contacts 317 (only one of them is labeled) on the sidewall 313 to be electrically coupled to the dies 311 of the first component 310. The electrical contacts 317 can be subjected to a surface treatment such as cleaning and roughening to improve ohm contact with the first conductive pattern 326. The first conductive pattern 326 can include bonding pads 322 and traces 324 extending from bonding pads 322. The first conductive pattern 326 can be made of a conductive material such as gold, copper, gold plated copper or the like. The method of forming a conductive pattern over the sidewall of a die stack will be described in more detail later in the specification.

Figure 8A:
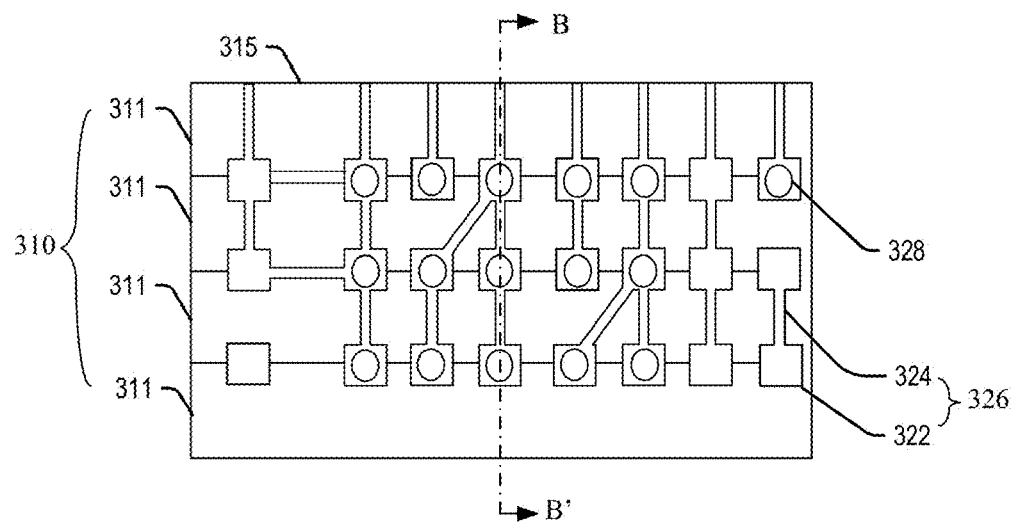
Figure 8B:
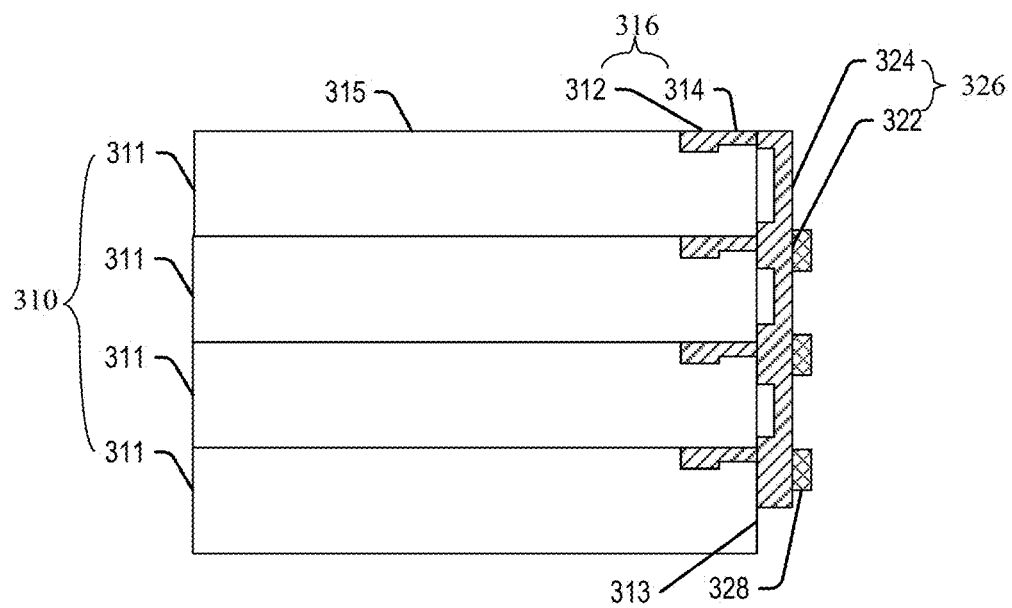

Next, at an optional step S440, one or more first connectors 328 are disposed on the first conductive pattern 326, for example on the bonding pads 322, as shown in a schematic front view of FIG. 8A and a schematic sectional view of FIG. 8B taken along line B-B' FIG. 8A. The first connectors 328 can be formed of a conductive material, such as solder balls, gold balls, gold bumps or copper bumps deposited on the bonding pads 322 of the first conductive pattern 326 by a known method.

Figure 9A:
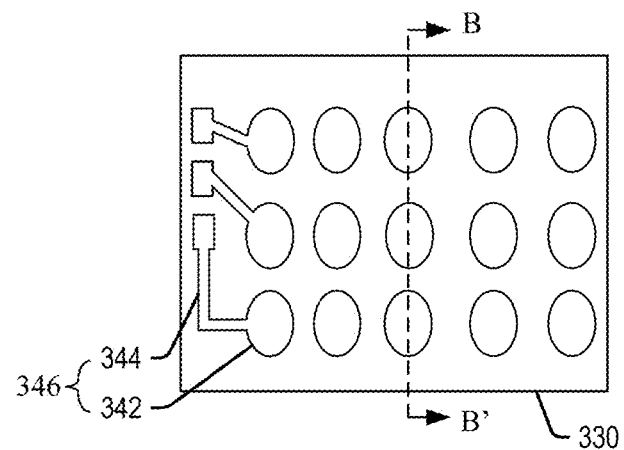
Figure 9B:
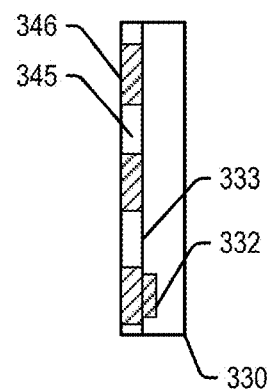

Next, at a step S450, a second conductive pattern 346 is formed on a surface 333 of a second component 330 including an electrical contact 332 formed on the surface 333, as shown in a schematic top view of FIG. 9A and a schematic sectional view of FIG. 9B. In the present embodiment, the second component 330 can include a controller die, an interposer, a charge pump or a passive device, for example a resistor, a capacitor or an inductor configured in a die form or a SMT form such as BGA. The electrical contact 332 can include bonding pads aligned along and spaced from the sides of the second component 330. The second conductive pattern 346 can be formed as following. An insulating layer 345 is first formed on the entire surface 313 of the second component 310, and then patterned to expose the designated electrical contacts 332 and leave openings for filling the conductive material. Next the conductive material is applied to fill the openings to form the second conductive pattern 346. The above processes can be repeated to form multi-level conductive layers so that the conductive interlayer(s) can interconnect the underlying electrical contacts 313 and the exposed second conductive pattern 346.

For example, the second conductive pattern 346 can include bonding pads 342 and traces 344 extending from the bonding pads 342 to the exposed electrical contacts 332. The bonding pads 342 of the second conductive pattern 346 can have a similar arrangement as that of corresponding bonding pads 322 of the first conductive pattern 326, so that the corresponding bonding pads 322 and bonding pads 342 can oppose to each other upon alignment. At least some of the bonding pads 342 of the second conductive pattern 346 are electrically connected to the underlying electrical contacts 332 of the second component 330 either via traces 344 as shown in FIG. 9A or by forming a respective one of bonding pads 342 directly on top of a corresponding one of electrical contacts 332 as shown in FIG. 9B, or even via conductive interlayer (not shown). Some of the bonding pads 342 can be dummy pads which are not electrically to any electrical contacts 332. In this case, the second conductive pattern 346 also serves as a RDL for the second component 330.

Figure 10A:
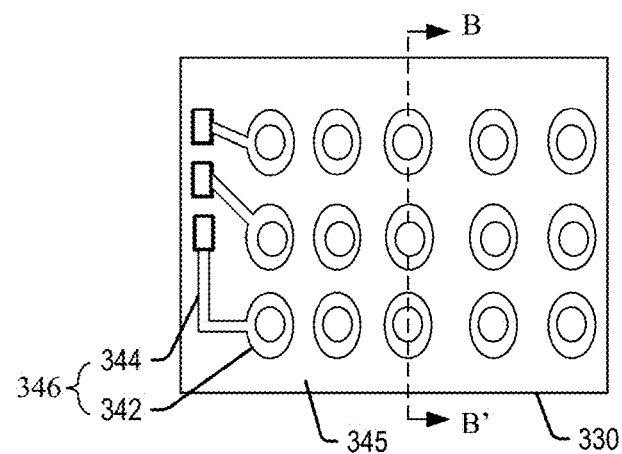
Figure 10B:
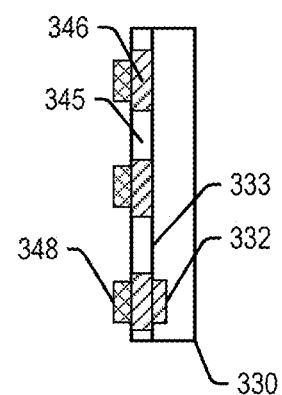
Figure 11A:
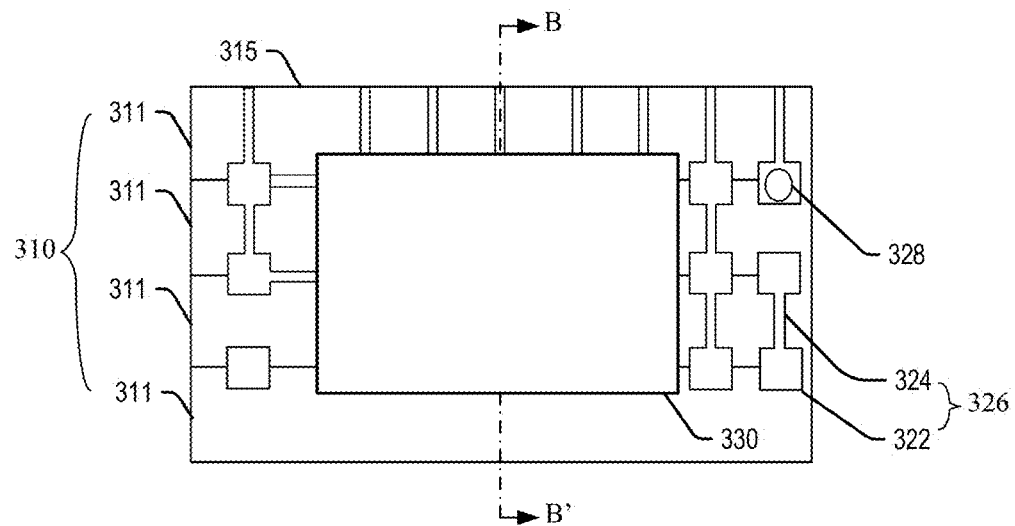
Figure 11B:
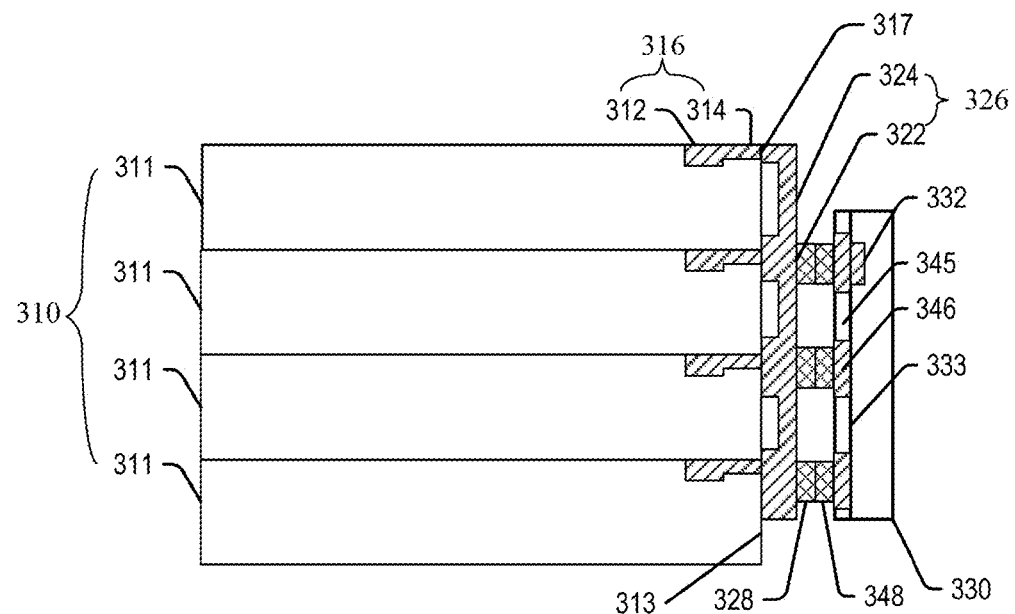
Figure 12A:
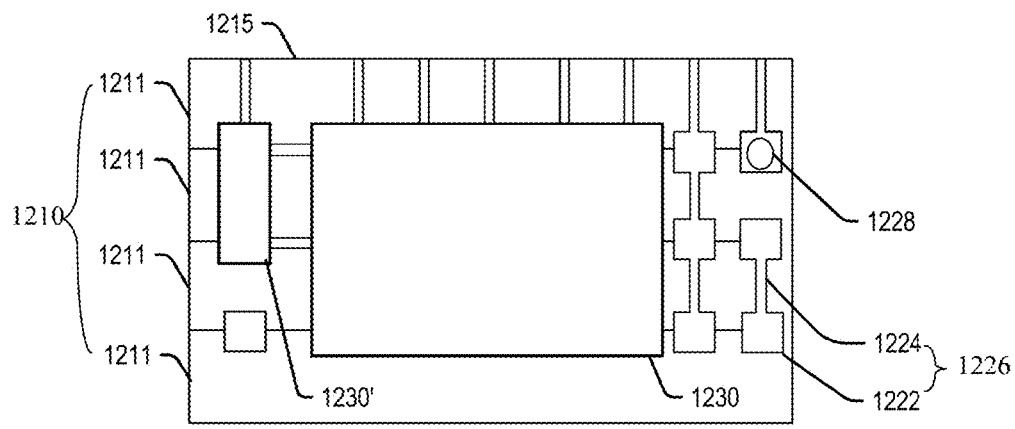
FIG. 12A and FIG. 12B are a schematic front view and a schematic top view of a semiconductor package according to a further embodiment of the present technology.
Figure 12B:
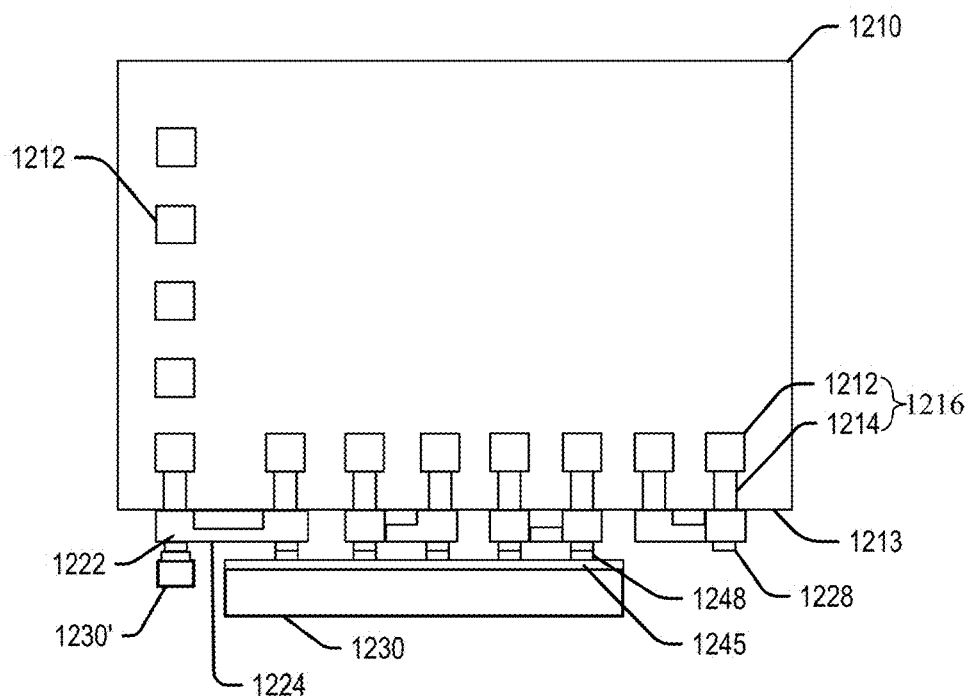

Next, at an optional step S460, one or more second connectors 348 are disposed on the second conductive pattern 346, as shown in a schematic top view of FIG. 10A and a schematic sectional view of FIG. 10B taken along line B-B' in FIG. 10A. For example, the second connectors 348 are deposited bonded on respective bonding pads 342 by a known method. The second connectors 348 can be formed of a conductive material, such as solder balls, gold balls, gold bumps or copper bumps.

Next, at a step S470, the second component 330 is aligned and affixed onto the sidewall 313 of the first component 310 by interconnecting the first conductive pattern 326 and the second conductive pattern 346. For example, the first component 310 and second component 320 are aligned with respect to each other so that the corresponding bonding pads 322 of the first conductive pattern 326 and bonding pads 342 of the second conductive pattern 346 opposes to each other. In this way, the corresponding first connectors 328 and second connectors 348 placed on respective bonding pads 322 and 342 can be bonded together by either a reflow process in case of connectors made of solder balls, or by a thermal pressing process at elevated temperature in case of connectors made of gold or copper bumps, as shown in a schematic front view of FIG. 11A and a schematic sectional view of FIG. 11B taken along line B-B' of FIG. 11A. The first and second connectors 328 and 348 can serve as cushions during the bonding process upon pressing the second component 330 against the first component 310, which can reduce damage risk of the first conductive pattern 326 and the second conductive pattern 346 during the bonding process. Alternatively, the second component 330 can be affixed onto the sidewall 313 of the first component 310 using only the first connectors 328 or only the second connectors 348.

The fabricating method of the semiconductor package according to the present embodiment can further include an encapsulating process to encapsulate the first component 310, the second component 330, conductive patterns 326 and 346, and the connectors within a protective material such as a molding compound so as to protect the semiconductor package against the environment.

In the above embodiments, one second component is affixed onto the sidewall of the first component. The semiconductor package according to the present technology is not limited thereto and can include more second components affixed onto the sidewall of the first component and electrically connected to the first component. The semiconductor package 1200 according to a further embodiment of the present technology include two second components 1230 and 1230' affixed onto the sidewall 1213 of the first component 1210, as shown in a schematic front view of FIG. 12A and a schematic top view of FIG. 12B. For example, the second components 1230 can be controller die and the second component 1230' can be passive device in a chip form, respectively. In the present embodiment, multiple second components with different functionalities can be affixed onto the sidewall of the first component and electrically connected to the first component, thus enhancing functionalities of the semiconductor package according to the present technology. Other aspects of the present embodiment are substantially the same as those of previous embodiments, and will not be repeated herein.

In the aforementioned embodiments, the second component is a monolithic component. The semiconductor package according to the present technology is not limited thereto and can include a second component composed of a plurality of dies. A semiconductor package 1300 according to a further embodiment will now be described more in detail with reference to a schematic perspective view of FIG. 13A, a sectional view of FIG. 13B taken along an X-Z plane B-B' in FIG. 13A and a sectional view of FIG. 13C taken along C-C' line shown in FIG. 13B.

Figure 13A:
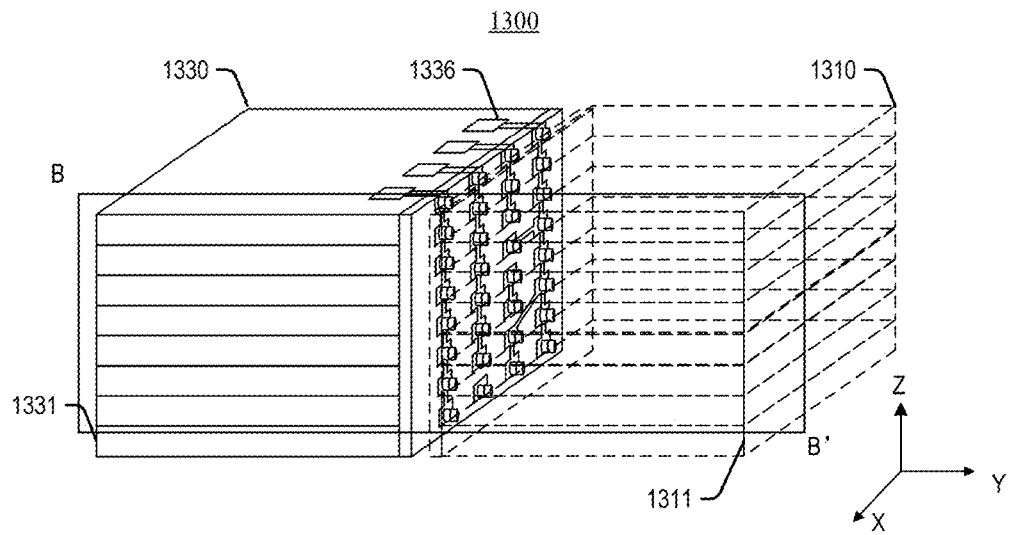
FIG. 13A to FIG. 13C are a schematic perspective view, a schematic sectional view taken along plane B-B' of FIG. 13A and a sectional view taken along line C-C' of FIG. 13B of a semiconductor package according to a further embodiment of the present technology.
Figure 13B:
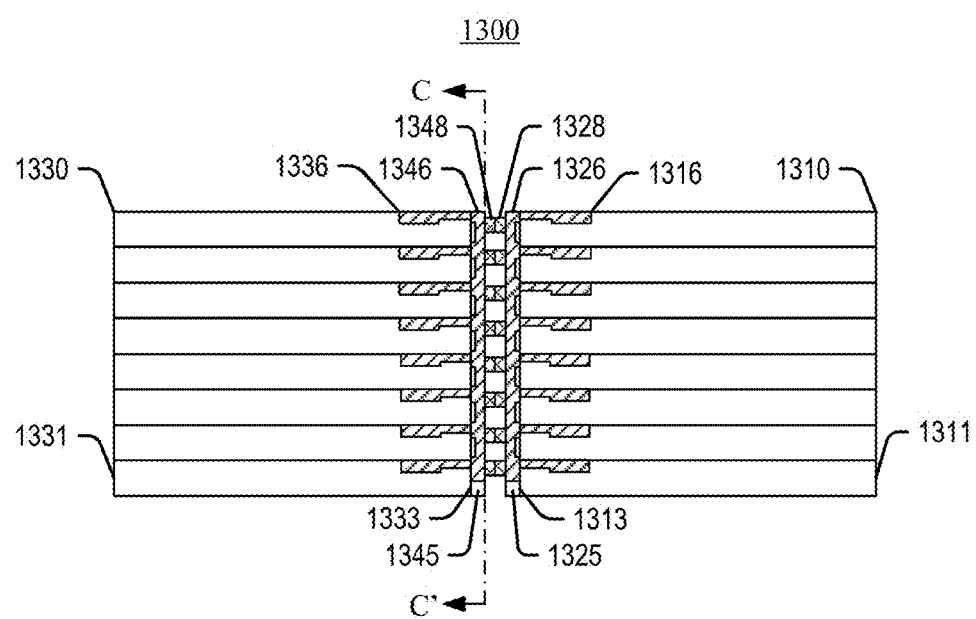
Figure 13C:
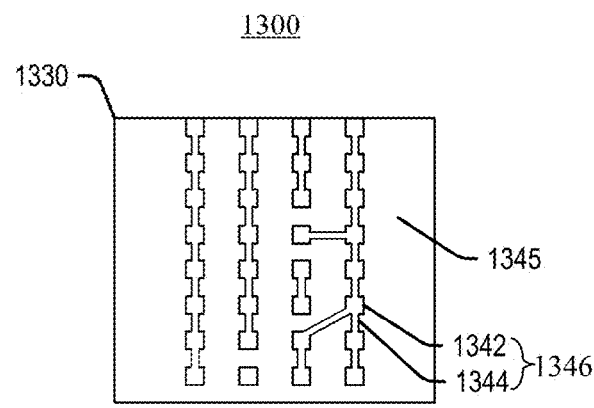

The semiconductor package 1300 includes a first component 1310 and a second component 1330. The first component 1310 is shown as a see-through component in FIG. 13A for the sake of illustration. Both the first component 1310 and the second component 1330 are configured with a similar TSW structure. That is, the first component 1310 includes a plurality of dies 1311 stacked vertically and aligned to form a common sidewall 1313, and a first conductive pattern 1326 is formed over the sidewall 1313 of the first component 1310 and electrically connected to the dies 1311. The second component 1330 includes a plurality of dies 1331 stacked vertically and aligned to form a common sidewall 1333, and a second conductive pattern 1346 is formed over the sidewall 1333 of the second component 1330 and electrically connected to the dies 1331. As shown in FIG. 13B and FIG. 13C, the second conductive pattern 1346 is formed in an insulating layer 1345 covering the sidewall 1333, and includes bonding pads 1342 and traces 1344 extending from the bonding pads 1342. The first component 1310 and the second component 1330 are arranged side by side, and the first conductive pattern 1326 and the second conductive pattern 1346 formed on the respective side surfaces 1313 and 1333 face each other. The first conductive pattern 1326 and the second conductive pattern 1346 can have a similar pattern so that the corresponding bonding pads 1342 of the second conductive pattern 1346 can oppose the bonding pads of the first conductive pattern 1326. In this case, first connectors 1328 and second connectors 1348 disposed on corresponding bonding pads of the first conductive pattern 1326 and the second conductive pattern 1346 can oppose each other and be bonded together by either a reflow process in case of connectors made of solder balls, or by a thermal pressing process at elevated temperature in case of connectors made of gold or copper bumps. In this way, the first component 1310 and the second component 1330 are connected physically and electrically together. According to the present embodiment, more dies such as memory dies can be grouped into multiple die stacks and integrated into a single semiconductor package, thus increasing the capacity of the memory device. Other aspects of the semiconductor package 1300 are substantially the same as those in previous embodiments, and will not be described in more detail.

Figure 14A:
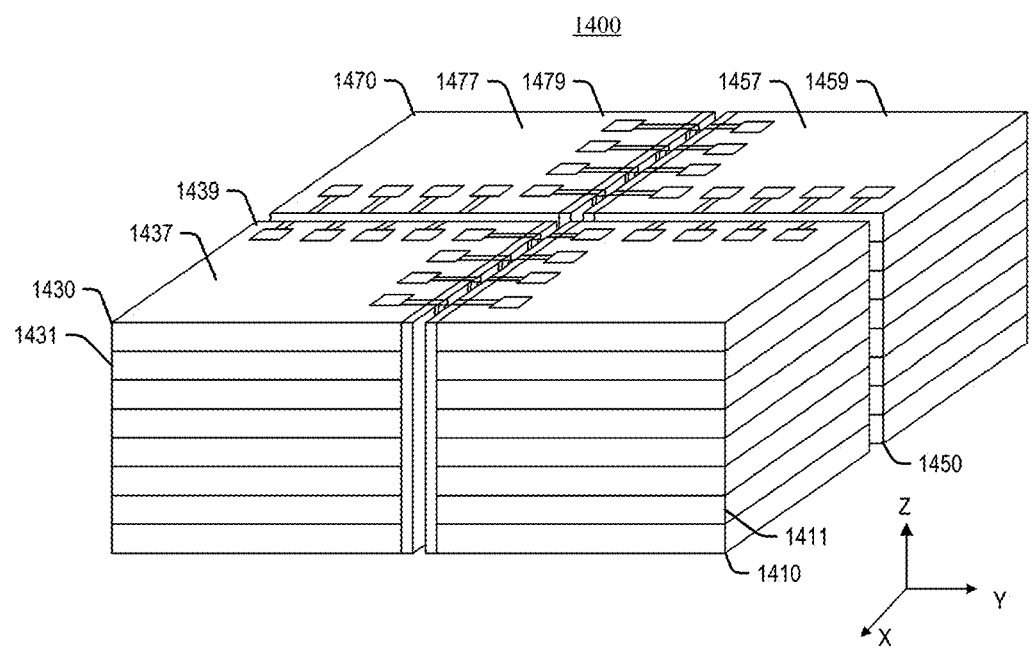
FIG. 14A and FIG. 14B are a schematic perspective view and a schematic top view of a semiconductor package according to a further embodiment of the present technology.
Figure 14B:
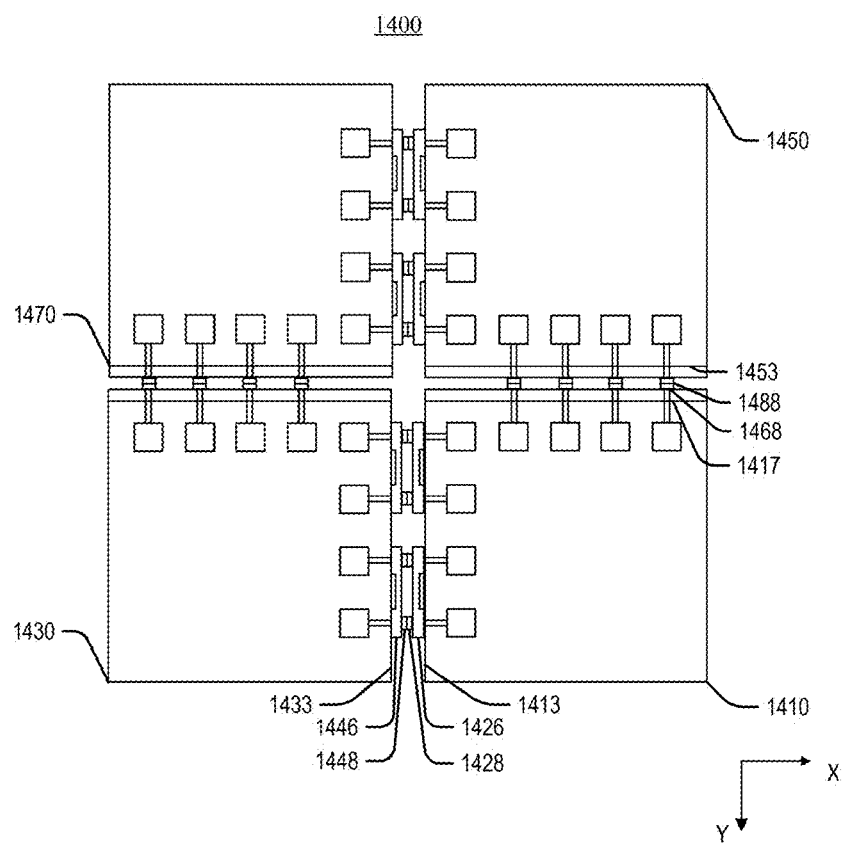

In the aforementioned semiconductor package, the second components are affixed onto a single sidewall of the die stack of the first component. The semiconductor package according to the present technology is not limited thereto and can include components affixed onto different aligned common sidewalls of the die stack of the first component. FIG. 14A and FIG. 14B show a schematic perspective view and a schematic top view of a semiconductor package 1400 according to further embodiment of the present technology, respectively. The semiconductor package 1400 includes a first component 1410, a second component 1430, a third component 1450 and a fourth component 1470 arranged in a two dimensional array. Each of the components 1410-1470 includes a plurality of dies stacked vertically, aligned to form at least two common flat sidewalls, and configured in a TSW structure. For example, the dies of the first component 1410 are aligned with their corresponding side surfaces extending in Y direction substantially coplanar with respect to each other to form a common sidewall 1413, and their corresponding side surfaces extending in X direction substantially coplanar with respect to each other to form a common sidewall 1415. In this case, the components 1410-1470 can be physically and electrically connected via the conductive patterns and connectors disposed on opposing sidewalls of adjacent components. For example, the first component 1410 is connected to the second component 1430 via a first conductive pattern 1426 on the sidewall 1413, a second conductive pattern 1446 on the sidewall 1433, and connectors 1428 and 1448 disposed between the first component 1410 and the second component 1430. The first component 1410 is also connected to the third component 1450 via conductive patterns on opposing sidewall 1417 of the first component 1410 and sidewall 1457 of the third component 1450 and connectors 1468 and 1488 disposed between the first component 1410 and the third component 1450. In the present embodiment, additional components can be distributed on different sidewalls of the memory stack of the first component, which can improve the flexibility of package design, and distribute electronic and thermal loads, and increase the device capacity by integrating more dies in a single package. Other aspects of the semiconductor package 1500 are substantially the same as those in previous embodiments, and will not be described in more detail.

In the aforementioned semiconductor packages, the components are interconnected via conductive pattern(s) formed over at least one sidewall of the die stack. The semiconductor package according to the present technology is not limited thereto and can include additional component(s) interconnected with the die stack via terminal conductive pattern formed on a terminal surface of the die stack of the first component. The terminal surface herein refers to a surface at one end of the first component, which can be either a top surface of a topmost die in the first component, or a bottom surface of the bottommost die in the first component.

Figure 15A:
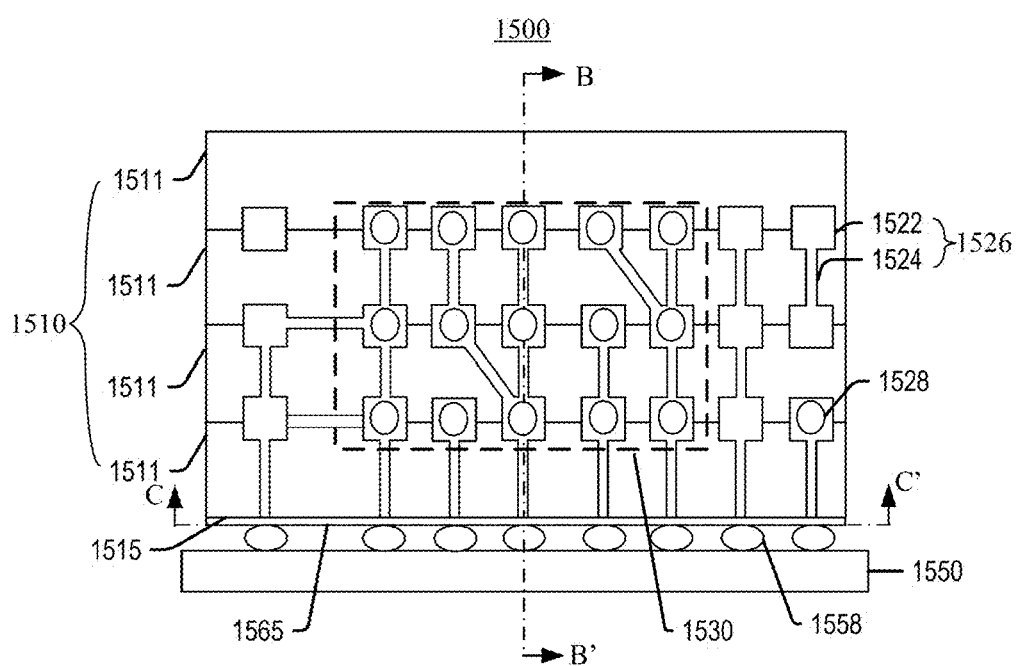
FIG. 15A, FIGS. 15B and 15C are schematic front view and schematic sectional views taken along line B-B' and line C-C' in FIG. 15A of a semiconductor package according to a further embodiment of the present technology.
Figure 15B:
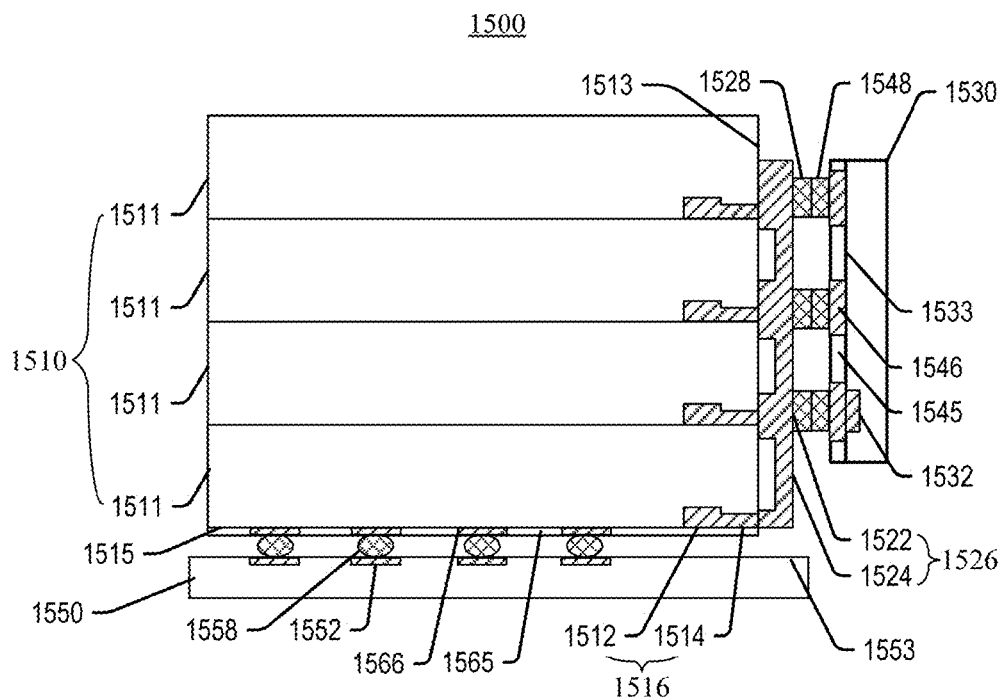
Figure 15C:
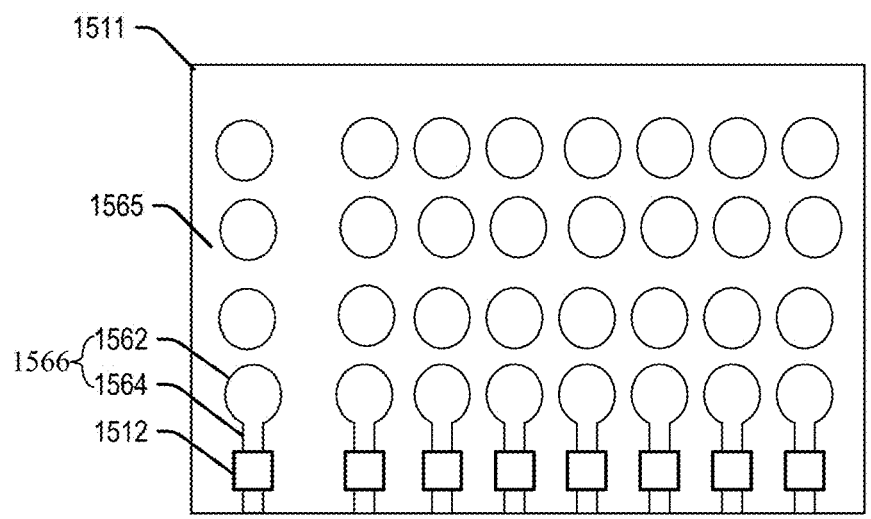

FIG. 15A, FIG. 15B and FIG. 15C are a schematic front view and schematic sectional views taken along line B-B' and line C-C' shown in FIG. 15A of a semiconductor package 1500 according to the present technology respectively. The semiconductor package 1500 includes a first component 1510, a second component 1530, and a third component 1550. The semiconductor package 1500 is substantially the same as the semiconductor package 300 shown in FIG. 3A to 3C except that the semiconductor package 1500 includes a terminal conductive pattern 1566 and an additional third component 1550 attached on a terminal surface of the die stack of the first component 1510. As shown in FIG. 15C, the terminal conductive pattern 1566 is formed in an insulating layer 1565 applied on a terminal surface 1515 of the die stack of the first component 1510. The terminal conductive pattern 1566 can include bonding pads 1562 and traces 1564 extending from respective bonding pads 1562, and at least partially electrically connected to the conductive pattern 1516 for example bonding pads 1512 of one of dies 1511 and/or the second conductive pattern 1526. In this case, the terminal conductive pattern 1566 serve as RDL to facilitate the electrical connection between the first component 1510 and the third component 1550. The third component 1550 can include a multiple layer PCB or an interposer. The third component 1550 is physically and electrically connected to the first component 1510 via the terminal conductive pattern 1566 and the third connectors 1558 disposed between bonding pads 1552 formed on a surface of the third component 1350 and bonding pads 1562 of the terminal conductive pattern 1566. In the present embodiment, the first component 1510 and the second component 1530 can be accommodated and supported on a PCB board, thus improving structure integrity and mechanical strength of the semiconductor package. Other aspects of the present embodiment are substantially the same as those in the embodiment shown in FIG. 3A to 3C, and will not be repeated herein. Similarly, the third component of a substrate can be attached onto a terminal conductive pattern formed on a terminal surface of the first component of the semiconductor packages shown in FIG. 12A to FIG. 12B and FIG. 13A to FIG. 13B so as to improve structure integrity and mechanical strength of the respective semiconductor package. The details of such modification of the embodiments will not be described further herein to avoid redundancy.

Figure 16:
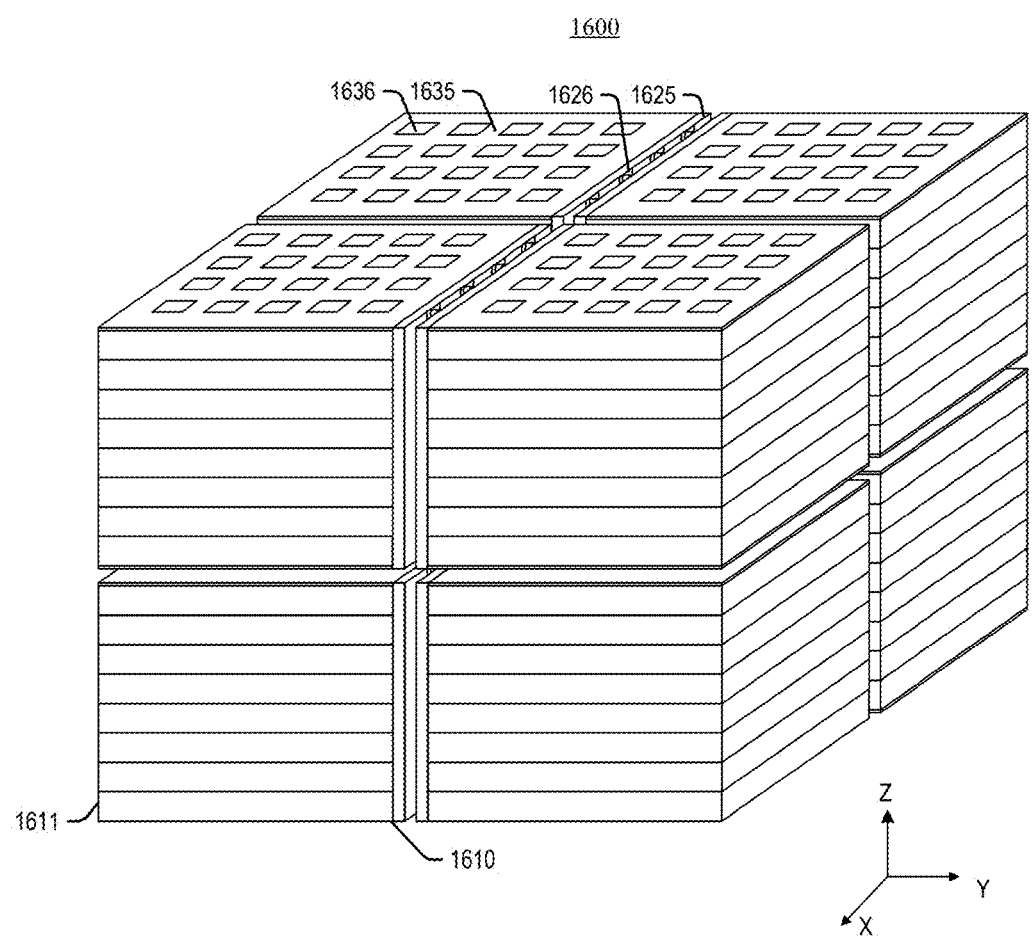
FIG. 16 is a schematic perspective view of a semiconductor package according to a further embodiment of the present technology.

A further embodiment of the present technology will now be described with reference to a schematic perspective view of FIG. 16. In the present embodiment, the semiconductor package 1600 includes a plurality of components 1610 (only one of them is labeled). Each of the components 1610 includes a plurality of dies 1611 (only one of them is labeled) vertically stacked and aligned with all four side surfaces substantially coplanar with respect to corresponding side surfaces of dies in the same stack to form four common sidewalls. Each of components 1610 is configured in a TSW structure, that is, sidewall conductive patterns 1626 (only one of them is labeled) are formed over the sidewalls of each of component 1610, and electrically connected to the dies 1611 of the respective component 1610. The sidewall conductive pattern can be formed in an insulating layer 1625. The components 1610 are arranged in a 3D matrix configuration and interconnected by the sidewall conductive patterns 1626 and connectors (not shown) disposed between opposing sidewall conductive patterns 1626 of adjacent components 1610 in X and Y directions, as well as terminal conductive patterns 1636 formed on terminal surface(s) of the respective component 1610 and connectors (not shown) disposed between opposing terminal conductive patterns 1636 of adjacent components 1610 in Z direction. In this way, both the sidewall conductive patterns 1626 and the terminal conductive patterns 1636 serve as RDL for interconnecting adjacent components 1610. The semiconductor package 1600 can be further encapsulated within a protective material such as molding compound (not shown).

The components 1610 in the semiconductor package 1600 can include dies 1611 with different functionality, for example memory dies, controller dies, processor dies, passive device dies, or even dummy dies serving as relay devices or interposers. In this way, the semiconductor package 1600 can be built up in a modular fashion. In this case, each of components 1610 in the package 1600 functions as an independent module, and the connectors and conductive patterns in the package serve as communication channels between different modules. In this way, the semiconductor package according to the present technology can be implemented as a novel modular semiconductor system with potential infinite capacity and functionalities if configured accordingly. For example, such semiconductor system can be implemented as a data center including a great number of interconnected storage devices each including multiple memory dies and other functional components managing the data.

Figure 17A:
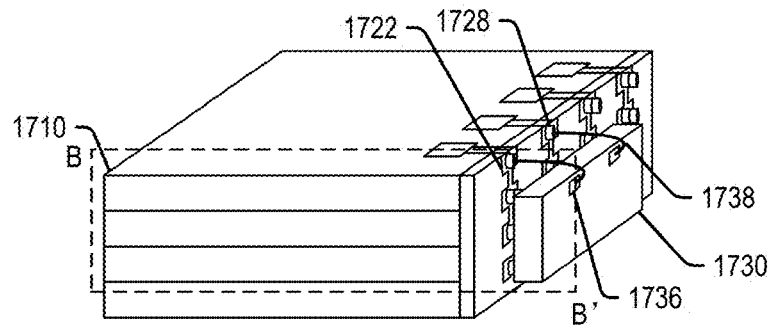
FIG. 17A and FIG. 17B are a schematic perspective view and a schematic sectional view taken along plane B-B' in FIG. 17A of a semiconductor package according to a further embodiment of the present technology.
Figure 17B:
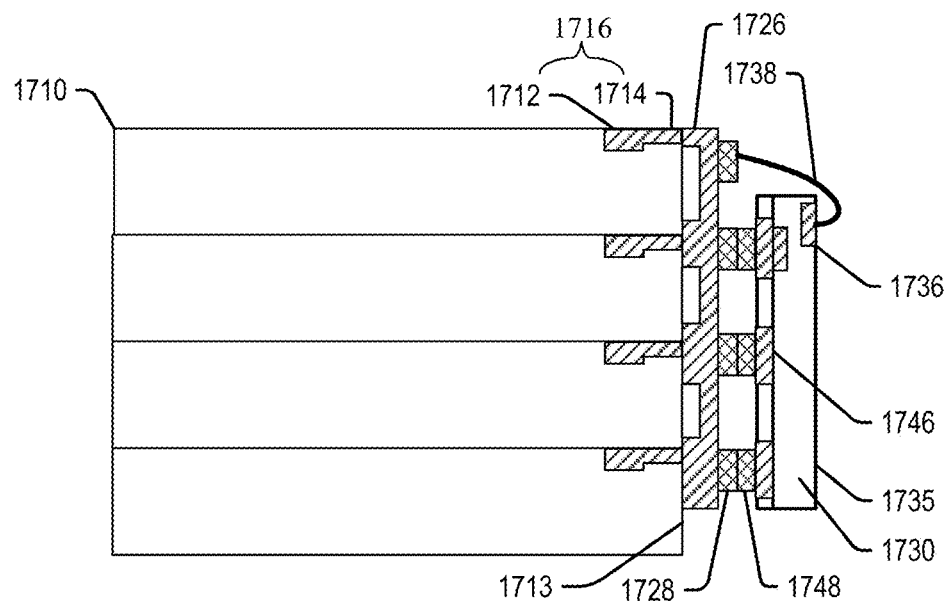

A semiconductor package 1700 according to a further embodiment of the present technology will now be described with references to a schematic perspective view of FIG. 17A and a schematic sectional view of FIG. 17B. The semiconductor package 1700 includes a first component 1710 and a second component 1730. The semiconductor package 1700 is substantially the same as the semiconductor package 300, except that the semiconductor package 1700 further includes wire bonds 1738 connecting bonding pads 1736 on a surface 1735 of the second component 1730 facing away the first semiconductor component 1710 to corresponding first connectors 1728 disposed on bonding pads 1722 of a first conductive pattern 1726 formed over a sidewall 1713 of the first component 1710. The semiconductor package 1700 utilizes both surfaces of the second component 1730 for connecting the second component 1730 to the first component 1710, thus providing more flexibility for circuit layout design of the second component 1730. Other aspects of the embodiment are substantially the same as those in the previous embodiments, and will not be repeated herein.

Figure 18:
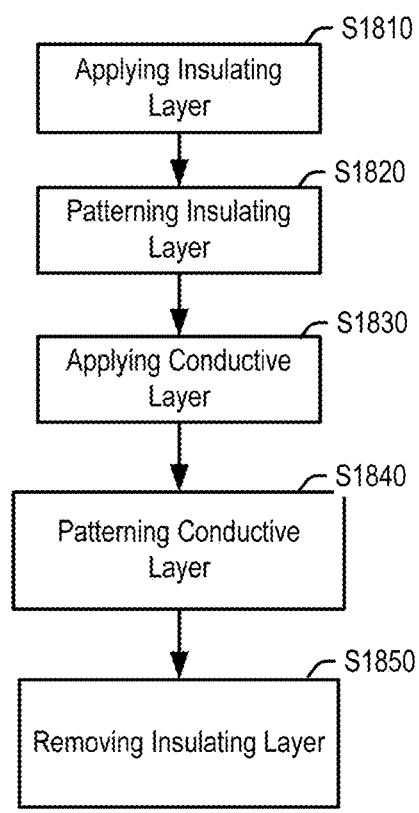
FIG. 18 is a flow chart showing a method of forming a conductive pattern on a sidewall of a die stack according to an embodiment of the present technology.
Figure 19A:
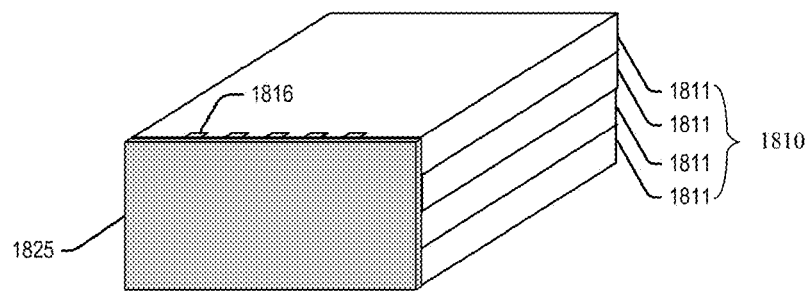
FIG. 19A to FIG. 23B are schematic views showing different stages of the method of forming the conductive pattern on the sidewall of the die stack according to an embodiment of the present technology.
Figure 19B:
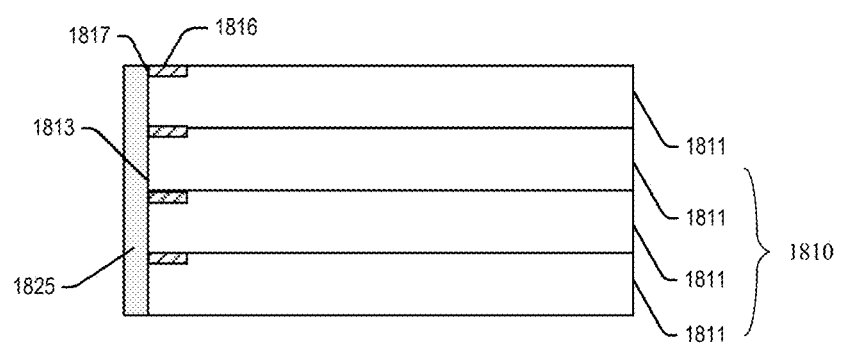

A method of forming a sidewall conductive pattern over a common planar sidewall of a die stack will now be described in more detail by referring to a flowchart of FIG. 18 and schematic views of FIG. 19A to FIG. 23B. Each of dies 1811 has a surface conductive pattern 1816 for example bonding pads arranged along an edge of the respective die and exposed on the sidewall 1813 to form electrical contacts 1817. As shown in FIG. 19A and FIG. 19B, at a step S1810, an insulating layer 1825 is formed on a common sidewall 1813 of a die stack 1810 including a plurality of dies 1811 by a known deposition process such as sputtering. The insulating layer 1825 covers exposed electrical contacts 1817 on the sidewall 1813. The insulating layer 1825 is for example a silicon oxide or silicon nitride, or other electrical insulators. The insulating layer 1825 can have a thickness of 20 µm to 200 µm, but may be thinner or thicker than that in further embodiments.

Figure 20A:
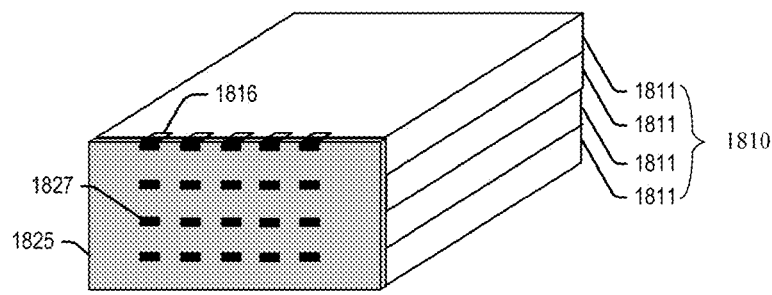
Figure 20B:
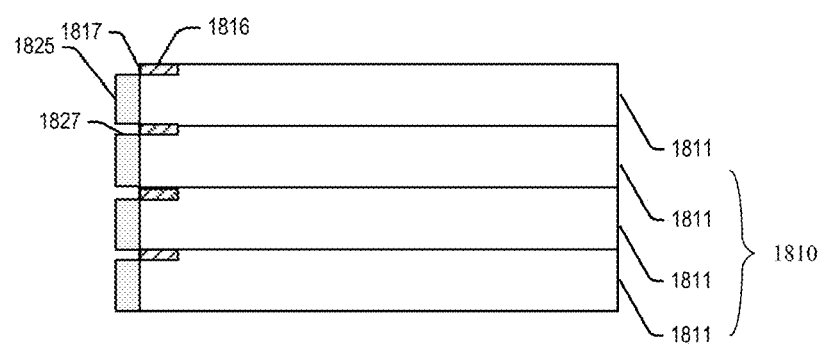

Next, at a step S1820, the insulating layer 1825 is patterned by a patterning process such as a lithography process including exposing, developing and etching steps in order to form openings 1827 penetrating the insulating layer 1825 and exposing the electrical contacts 1817 on the sidewall 1813, as shown in FIG. 20A and FIG. 20B.

Figure 21A:
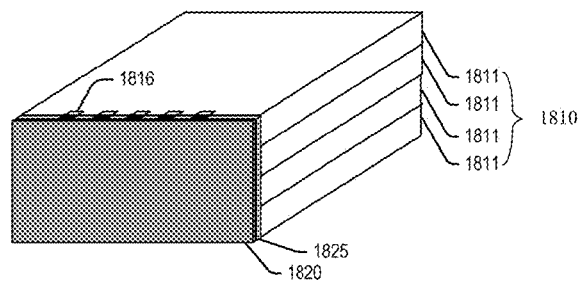
Figure 21B:
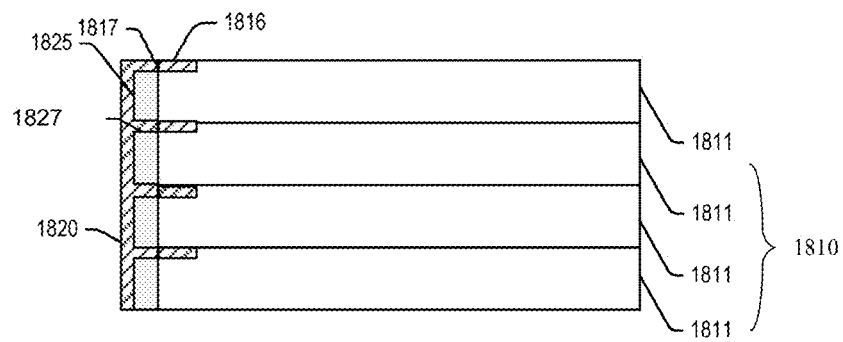

Next at a step of S1830, a conductive layer 1820 is applied over the insulating layer 1825 and into an opening 1827 in order to make contact with the electrical contacts 1817, as shown in FIG. 21A and FIG. 21B. The conductive layer 1820 is applied by a known method such as sputtering or plating. The conductive layer 1820 is for example formed of copper, gold, aluminum, tungsten, nickel or alloys thereof. The conductive layer 1820 may be 2-5 µm thick, but may be thicker or thinner than that in further embodiments. Annealing may optionally be performed to adjust a metal grain condition in the conductive layer 1820.

Figure 22A:
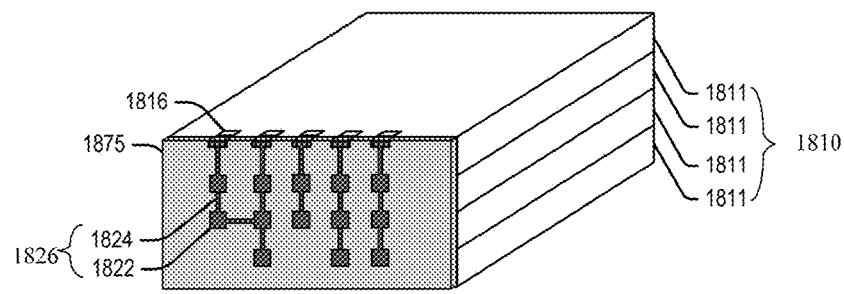
Figure 22B:
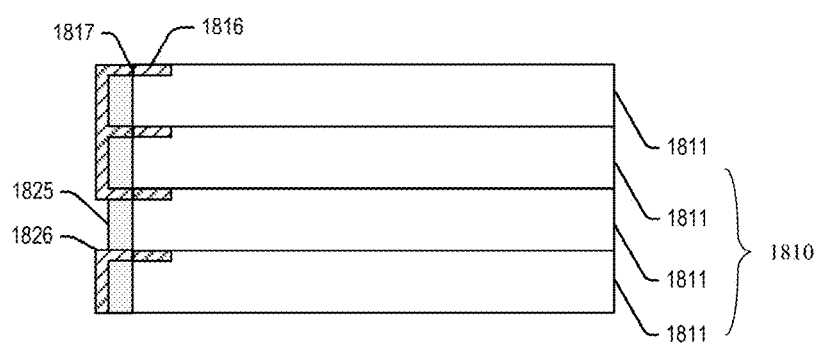

Next at a step of S1840, as shown in FIG. 22A and FIG. 22B, the conductive layer 1820 is patterned into a sidewall conductive pattern 1826 including bonding pads 1822 and the traces 1824 by a known patterning process such as lithography process including exposing, developing and etching steps using a mask. Alternatively, the conductive pattern 1826 can be formed on the insulating layer 1825 by a screen printing method. The process can additionally or alternatively employ wet or dry etching methods and chemical mechanical planarization (CMP) process.

Figure 23A:
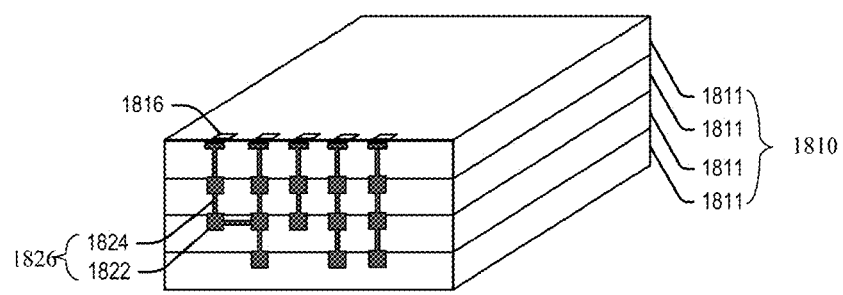
Figure 23B:
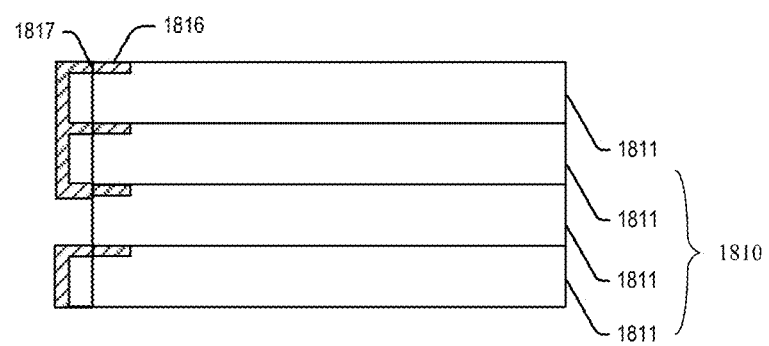

Optionally at a step S1850, the insulating layer 1825 beneath the conductive pattern 1826 including the bonding pads 1822 and traces 1824 can be removed by a selective etching process to leave the sidewall conductive pattern 1826 spaced apart from the sidewall 1813, as shown in FIG. 23A and FIG. 23B.

In summary, in an aspect of the present technology, a semiconductor package comprises: a first component comprising a plurality of first dies stacked on top of each other, each of first dies comprising at least one side surface and an electrical contact exposed on the side surface, and the plurality of first dies aligned so that the corresponding side surfaces of all first dies substantially coplanar with respect to each other to form a common sidewall; a first conductive pattern formed over the sidewall and at least partially spaced away from the sidewall, the first conductive pattern electrically interconnecting the electrical contacts of the plurality of first dies; at least one second component; and a second conductive pattern formed on a surface of the second component, the second conductive pattern affixed and electrically connected to the first conductive pattern formed over the sidewall of the first component.

In another aspect of the present technology, a semiconductor system comprises a plurality of components arranged in a 3 dimensional matrix configuration and interconnected by opposing conductive patterns disposed on opposing surfaces of adjacent components, each component comprising a plurality of dies stacked on top of each other, the dies in the stack are dimensioned and aligned so that corresponding side surfaces of all dies substantially coplanar with respect to each other to form four common sidewalls. The conductive patterns comprise sidewall conductive patterns formed over the respective sidewalls of components and at least partially spaced away from the respective sidewalls, the sidewall conductive patterns electrically interconnecting the plurality of dies in the respective components, and terminal conductive patterns formed on terminal surfaces of the respective components.

In another aspect of the present technology, a method of forming a semiconductor package comprises: preparing a first component comprising a plurality of first dies stacked on top of each other, each first die comprising at least one side surface and electrical contact exposed on the side surface, and the plurality of first dies aligned so that the corresponding side surfaces of all first dies substantially coplanar with respect to each other to form a common sidewall; forming a first conductive pattern over the sidewall of a first component and at least spaced apart from the sidewall of the first component, the first conductive pattern electrically interconnecting the electrical contacts of the plurality of first dies; forming a second conductive pattern on a surface of a second component; and affixing the second component onto the sidewall of the first component by interconnecting the first conductive pattern and the second conductive pattern.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor package, comprising:
   a first component comprising a plurality of first dies stacked on top of each other, each of the first dies comprising at least one side surface and an electrical contact exposed on the side surface and terminating at the side surface, and the plurality of first dies aligned so that the corresponding side surfaces of all first dies are substantially coplanar with respect to each other to form a common sidewall;
   a first conductive pattern formed over the sidewall, the first conductive pattern comprising:
      a first portion comprised of two or more sections in contact with the sidewall and electrically coupled to the electrical contacts of the plurality of first dies, and
      a second portion comprised of one or more second sections between each of the two or more sections of the first portion, the one or more second sections spaced away from the sidewall;
   at least one second component; and
   a second conductive pattern formed on a surface of the second component, the second conductive pattern affixed and electrically connected to the first conductive pattern.

2. The semiconductor package of claim 1, wherein
   the first conductive pattern of the first component comprises one or more first bonding pad,
   the second conductive pattern of the second component comprises one or more second bonding pads, and
   the corresponding first bonding pads and second bonding pads are aligned with respect to each other.

3. The semiconductor package of claim 2, further comprising:
   one or more connectors bonded between the first conductive pattern and second conductive pattern.

4. The semiconductor package of claim 3, wherein
   the one or more connectors comprises one or more first connectors disposed on the first bonding pads of the first conductive pattern and one or more second connectors disposed on the second bonding pads of the second conductive pattern,
   the first connector and the second connector on the corresponding first bonding pads and the second bonding pads are electrically connected.

5. The semiconductor package of claim 3, wherein
   the connectors comprise solder balls, gold balls, copper bumps or gold bumps.

6. The semiconductor package of claim 1, wherein
   the first dies of the first component comprise memory dies, controller dies, processor dies, passive device dies, or dummy dies.

7. The semiconductor package of claim 1, wherein
   the second component comprises a controller die, an interposer, a charge pump, a passive device, or a printed circuit board.

8. The semiconductor package of claim 1, wherein
   the second component comprises a plurality of second dies stacked on top of each other, each of second dies comprising at least one side surface and an electrical contact exposed on the side surface, and the plurality of second dies aligned so that the corresponding side surfaces of all second dies substantially coplanar with respect to each other to form a common sidewall; and
   the second conductive pattern is formed over the sidewall of the second component and at least partially spaced away from the sidewall of the second dies, the second conductive pattern electrically interconnecting the electrical contacts of the plurality of second dies.

9. The semiconductor package of claim 1, further comprises:
   a third component attached on a terminal surface of the first component and electrically connected to the first component via a terminal conductive pattern formed on the terminal surface of the first component.

10. The semiconductor package of claim 9, wherein
    the terminal surface of the first component comprises a top surface of a topmost die in the first component, or a bottom surface of the bottommost die in the first component.

11. The semiconductor package of claim 10, wherein
    the third component comprises a plurality of third dies stacked on top of each other, each of third dies comprising at least one side surface and an electrical contact exposed on the side surface, and the plurality of third dies aligned so that the corresponding side surfaces of all third dies substantially coplanar with respect to each other to form a common sidewall.

12. The semiconductor package of claim 1, further comprising:
wire bonds formed between bonding pads on a surface of the second component facing away the first component and the first conductive pattern.

13. A semiconductor system, comprising:
a plurality of components comprising components aligned with each other in three orthogonal directions and physically and electrically interconnected by opposing conductive patterns disposed on opposing surfaces of adjacent components, each component comprising a plurality of dies stacked on top of each other, the dies in the stack are dimensioned and aligned so that corresponding side surfaces of all dies are substantially coplanar with respect to each other to form four common sidewalls,
wherein the conductive patterns comprise sidewall conductive patterns formed over the respective sidewalls of components and at least partially spaced away from the respective sidewalls, the sidewall conductive patterns electrically interconnecting the plurality of dies in the respective components, and terminal conductive patterns formed on terminal surfaces of the respective components.

14. The semiconductor system of claim 13, wherein the sidewall and terminal conductive patterns comprise one or more bonding pads,
the bonding pads of opposing conductive patterns are aligned with respect to each other.

15. The semiconductor system of claim 14, further comprising one or more connectors disposed and bonded between opposing bonding pads of the opposing conductive patterns for interconnecting adjacent components.

16. The semiconductor system of claim 15, wherein
the connectors comprise solder ball, gold ball, copper bump or gold bump.

17. A semiconductor package, comprising:
a first component comprising a plurality of first dies stacked on top of each other, each of the first dies comprising at least one side surface and first means, exposed on the side surface, for transferring electrical signals to and from each of the first dies, and the plurality of first dies aligned so that the corresponding side surfaces of all first dies are substantially coplanar with respect to each other to form a common sidewall;
second means for electrically interconnecting the first means of the plurality of first dies, the second means comprising:
a first portion comprised of two or more sections in contact with the sidewall and electrically coupled to the electrical contacts of the plurality of first dies, and
a second portion comprised of one or more second sections between each of the two or more sections of the first portion, the one or more second sections spaced away from the sidewall;
at least one second component including a plurality of dies having third means for transferring electrical signals to and from each of the plurality of dies of the at least one second component; and
fourth means, formed on a surface of the at least one second component, for electrically interconnecting the second means of the plurality of first dies and the third means of the second plurality of dies.

* * * * *